(12) United States Patent
Fan et al.

(10) Patent No.: US 8,148,646 B2
(45) Date of Patent: Apr. 3, 2012

(54) PROCESS OF POSITIONING GROUPS OF CONTACT STRUCTURES

(75) Inventors: Li Fan, San Ramon, CA (US); Michael J. Armstrong, Danville, CA (US); John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 633 days.

(21) Appl. No.: 12/240,505

(22) Filed: Sep. 29, 2008

(65) Prior Publication Data

US 2010/0078206 A1    Apr. 1, 2010

(51) Int. Cl.
*H05K 1/11* (2006.01)

(52) U.S. Cl. ...... 174/261; 361/760; 439/66; 324/754.03

(58) Field of Classification Search ............... 174/68.1, 174/250–267; 361/707–710, 712–713, 717, 361/719–722, 760–761, 764, 769
See application file for complete search history.

(56) References Cited

U.S. PATENT DOCUMENTS

| | | | |
|---|---|---|---|
| 3,982,979 A | 9/1976 | Hentz et al. | |
| 4,784,972 A | 11/1988 | Hatada | |
| 4,980,971 A | 1/1991 | Bartschat et al. | |
| 5,309,223 A | 5/1994 | Konicek et al. | |
| 5,331,406 A | 7/1994 | Fishbaine et al. | |
| 5,476,211 A | 12/1995 | Khandros | |
| 5,806,181 A | 9/1998 | Khandros et al. | |
| 6,640,415 B2 | 11/2003 | Eslamy et al. | |
| 6,690,185 B1 | 2/2004 | Khandros et al. | |
| 7,010,854 B2 | 3/2006 | Eldridge et al. | |
| 7,064,566 B2 | 6/2006 | Khandros et al. | |
| 7,287,322 B2 * | 10/2007 | Mathieu et al. | 29/842 |
| 7,674,112 B2 * | 3/2010 | Gritters et al. | 439/66 |
| 7,798,822 B2 * | 9/2010 | Eldridge et al. | 439/81 |
| 2001/0012739 A1 * | 8/2001 | Grube et al. | 439/862 |
| 2002/0019152 A1 * | 2/2002 | Eldridge et al. | 439/66 |
| 2003/0192176 A1 * | 10/2003 | Eldridge et al. | 29/832 |
| 2003/0199179 A1 * | 10/2003 | Dozier et al. | 439/66 |

* cited by examiner

*Primary Examiner* — Courtney Smith
(74) *Attorney, Agent, or Firm* — Kirton & McConkie

(57) ABSTRACT

A contact apparatus can be made by providing a first substrate with electrically conductive terminals and second substrates each of which can have contact structures. Each of the contact structures can have a contact tip. The second substrates can be aligned such that contact tips of the contact structures are aligned substantially in a plane. An optical system can be used to monitor an actual position of the second substrates, and a mechanical system can be used to move the second substrates to aligned positions. The contact structures can be attached to ones of the terminals on the first substrate while the second substrates are in the aligned positions.

10 Claims, 16 Drawing Sheets

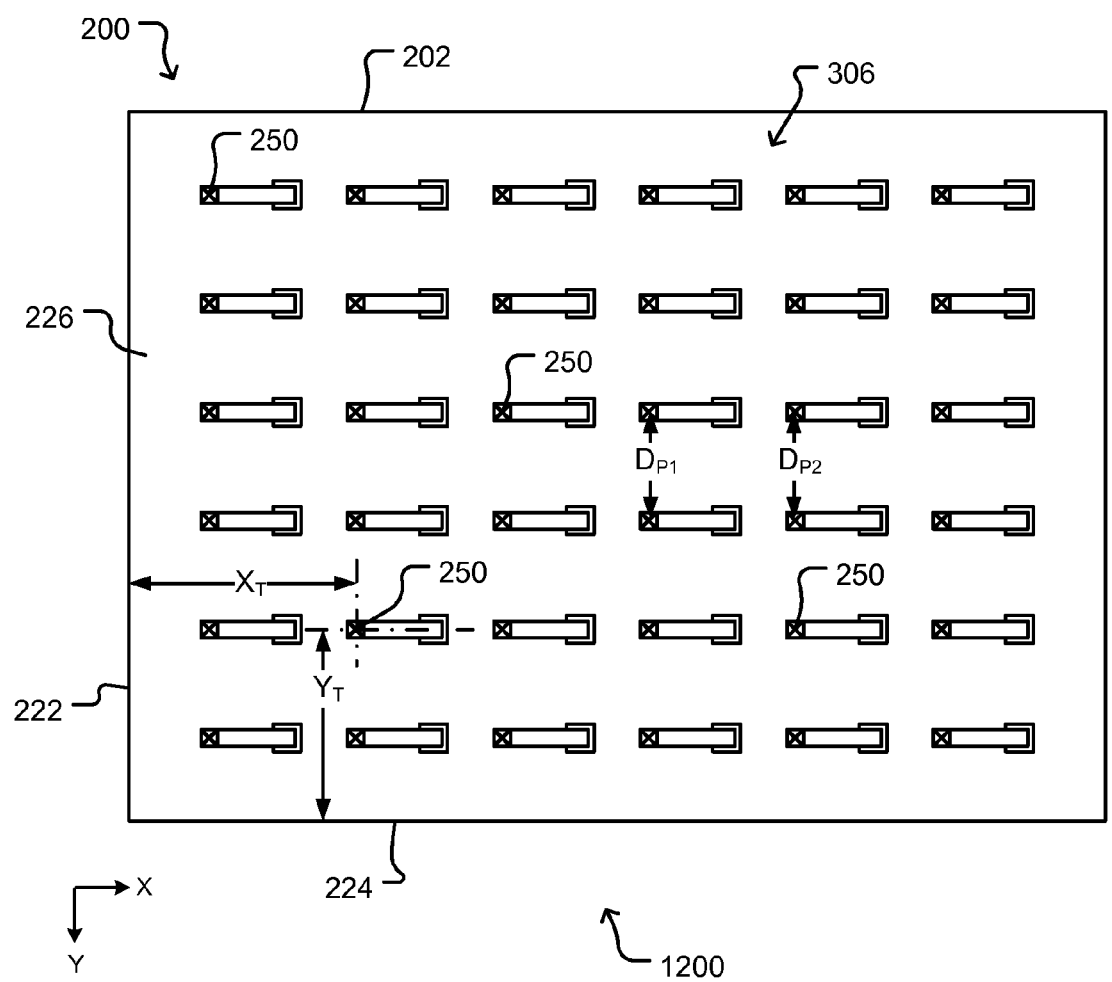

PROCESS OF POSITIONING GROUPS OF CONTACT STRUCTURES

BACKGROUND

There are many applications in which it is desirable to form a group (e.g., an array, whether a regular array or an irregular array) of structures in which the structures are aligned one with another in space. For example, it may be desirable for a group of such structures to be aligned one with another such that each structure is located in a plane, such as an "x, y" plane (where "x" and "y" are perpendicular axes) and a part of each structure is located a particular distance from the plane (e.g., along a "z" axis that is perpendicular to the "x, y" plane).

A non-limiting example of such an application can be a group of electrically conductive contacts arranged to contact input and/or output terminals on electronic devices to make electrical connections with such devices. For example, such a group of contacts can be part of a testing device for making temporary electrical connections with the electronic devices to test the electronic devices. In some applications, it may be advantageous to utilize a group of many such contacts in order to contact and test many electronic devices at once. It may be advantageous to located such contacts in a plane (e.g., a plane defined by perpendicular "x" and "y" axes) so that each contact aligns with one of the terminals on the electronic devices. It may also be advantageous to align tips of the contacts a uniform distance (e.g., along a "z" axis) from the plane so that the tips of the contacts are disposed in a generally regular plane that corresponds to a plane of the terminals of the electronic devices. It can also be advantageous to align such contacts to a non-planar contour rather than a plane.

Although the invention disclosed herein is not limited to providing the foregoing advantages or even to providing solutions to problems relating to aligning a group of structures, some embodiments of the invention can provide such solutions so that features of the structures (e.g., contact portions, such as tips, of the contacts) are properly positioned.

SUMMARY

In some embodiments, a process of making a contact apparatus can include providing a first substrate with electrically conductive terminals and second substrates each of which can have contact structures. Each of the contact structures can have a contact tip. The process can further include aligning the second substrates such that contact tips of the contact structures of the second substrates are aligned substantially in a plane. The aligning can utilize an optical system to monitor an actual position of the second substrates and a mechanical system to move the second substrates to aligned positions. The process can further include attaching the contact structures of the second substrates to ones of the terminals on the first substrate while the second substrates are in the aligned positions.

In some embodiments, a process of making a contact apparatus can include heating a first substrate having electrically conductive terminals. The process can also include positioning a second substrate having contact structures in proximity to the first substrate such that attachment portions of the contact structures are in contact with a flowable joining material that is also in contact with ones of the terminals of the first substrate. The first substrate can be heated to a temperature such that a temperature of the flowable material is less than the melting temperature of the flowable joining material. The process can further include heating the second substrate to a temperature sufficient to melt the flowable material.

In some embodiments, a contact apparatus can include a substrate with terminals disposed on a surface of the substrate. The contact apparatus can also include contact structures attached to ones of the terminals. Each contact structure can have an attachment portion attached to one of the terminals and a tip disposed away from the surface of the substrate. The tips of the contact structures can be aligned in a plane such that each tip is within one micron of a reference plane.

In some embodiments, a process of making a contact apparatus can include providing a first substrate having electrically conductive first terminals. The process can also include providing second substrates each having contact structures attached to second terminals on a first surface of the second substrate. Each contact structure can have a contact tip. The process can also include aligning the second substrates such that the contact tips of the contact structures are aligned substantially in a plane. The aligning can be accomplished by utilizing an optical system to monitor an actual position of the second substrates and a mechanical system to move the second substrates to aligned positions. While the second substrates are in the aligned positions, third terminals of the second substrates can be attached to the first terminals on the first substrate. For each of the second substrates, the third terminals can be on a second surface of the second substrate, which can be opposite the first surface, and the third terminals can be electrically connected through the second substrate to the second terminals.

In some embodiments, a contact apparatus can include a first substrate having first terminals. The contact apparatus can also include second substrates each having second terminals on a first surface of the second substrate and third terminals on a second surface of the second substrate opposite the first surface. Third terminals can be electrically connected to the second terminals, and the third terminals can be attached the first terminals. Contact structures can be attached to the second terminals of the second substrates, and each contact structure can have an attachment portion attached to one of the second terminals and a tip disposed away from the attachment portion. The tips of the contact structures can be aligned in a plane such that each tip is within one micron of the plane.

BRIEF DESCRIPTION OF THE DRAWINGS

FIG. 12C shows a top view of the first substrate of FIG. 2 with a group of contact structures from a plurality of the second substrates of FIG. 3 attached to terminals of the first substrate according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

Figure 1:
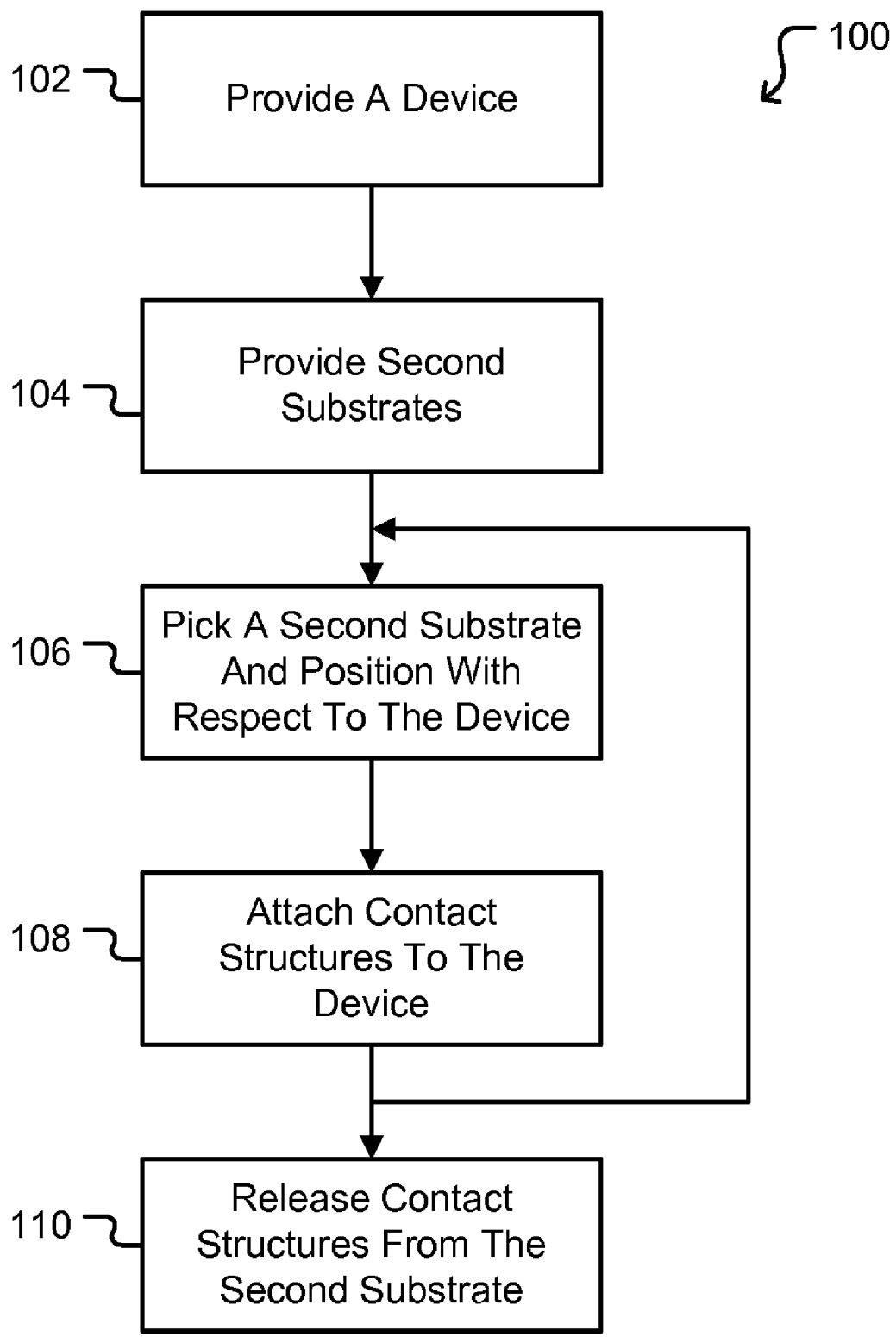
FIG. 1 illustrates an exemplary process for making a group of aligned structures according to some embodiments of the invention.

FIG. 1 illustrates an exemplary process 100 for making an apparatus with a group of contact structures having features that are aligned with each other and/or with a reference feature or features according to some embodiments of the invention. Although the contact structures that can be placed in alignment using the process 100 of FIG. 1 need not be limited to contact structures, the process 100 of FIG. 1 will be described with respect to an example illustrated in FIGS. 2-12C for ease of discussion and illustration and not by way of limitation.

Figure 2:
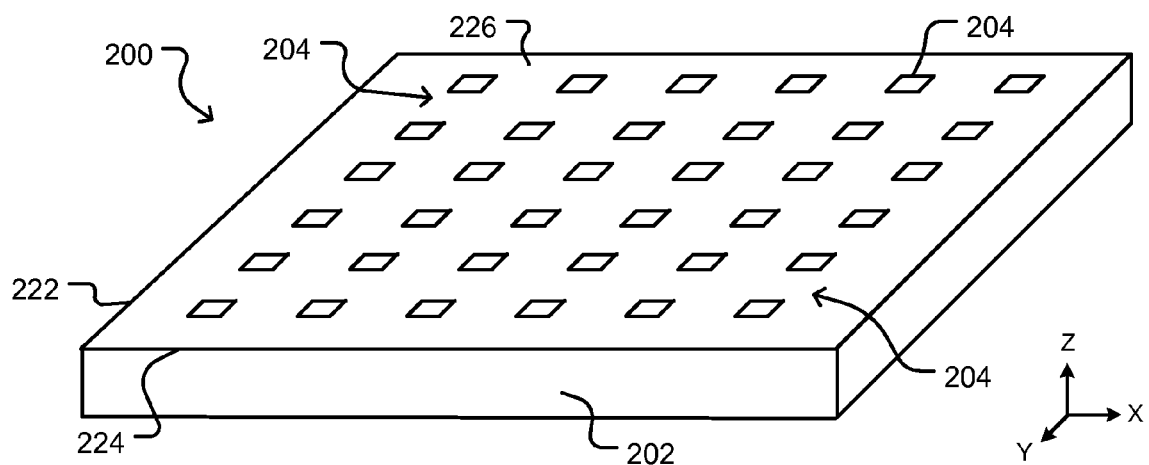
FIG. 2 illustrates an exemplary first substrate with terminals according to some embodiments of the invention.

As shown in FIG. 1, process 100 can include providing (e.g., supplying, making, or otherwise obtaining) a device at 102. A non-limiting example of a device 200 that can be provided at 102 is shown in FIG. 2. As shown in FIG. 2, device 200 can comprise a first substrate 202 on which are disposed a plurality of terminals 204 (which can be non-limiting examples of contact structures). For example, as shown in FIG. 2, terminals 204 can be disposed on a surface 226 of the device 200. Device 200 can be any device to which a group of contact structures (e.g., probe structures) are to be attached. For example, the first substrate 202 can comprise a ceramic wiring substrate, a printed circuit board, etc. The terminals 204 can be electrically conductive. In some examples, the terminals 204 can be electrically connected (e.g., by internal and/or external wiring, traces, vias, etc. in and/or on the first substrate 202) to each other, to terminals (not shown) on the opposite surface (not shown) of the first substrate 202, to internal circuit elements (not shown) embedded in the first substrate 202, and/or to circuit elements (not shown) disposed on the first substrate 202. Edges 222 and/or, 224 are identified in FIG. 2, and one or more of such edges or other features (e.g., alignment marks) of the first substrate 202 can function as positional references.

Figure 3:
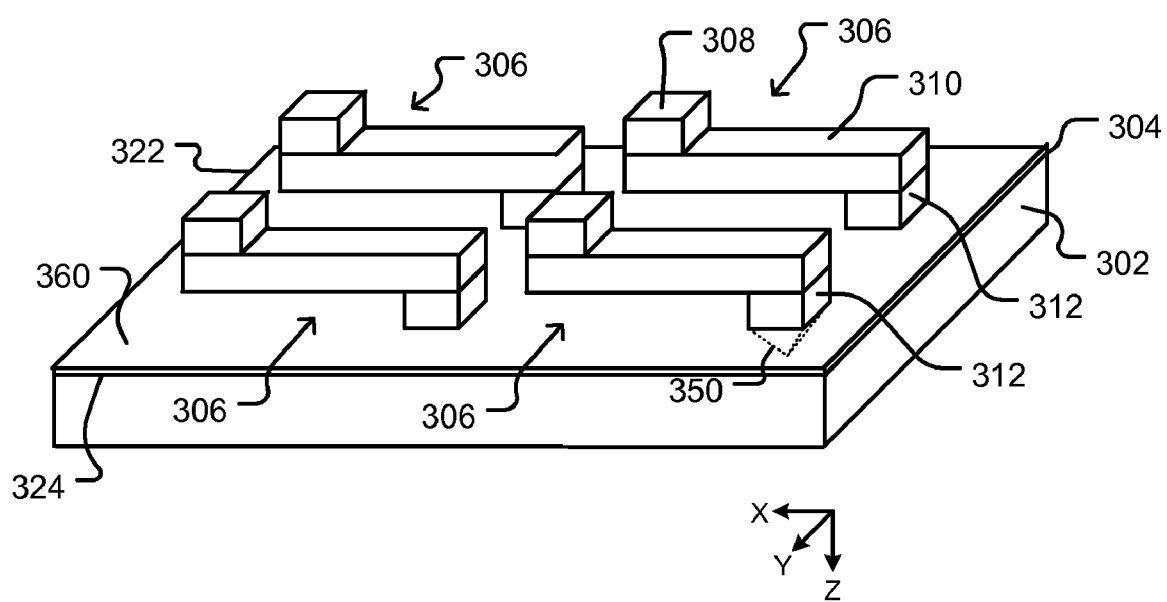
FIG. 3 illustrates an exemplary second substrate with a plurality of contact structures according to some embodiments of the invention.

Referring again to FIG. 1, process 100 can also include, at 104, providing (e.g., supplying, making, or otherwise obtaining) a plurality of second substrates on which are disposed a plurality of contact structures. FIG. 3 illustrates a non-limiting example of one such second substrate 302 according to some embodiments of the invention. As shown in FIG. 3, a plurality of contact structures 306 (which can be non-limiting examples of contact elements) can be formed on or otherwise attached to the second substrate 302. The second substrate 302 can comprise any structure, material, or device suitable for supporting contact structures 306. Non-limiting examples of suitable second substrates 302 include a silicon substrate, a ceramic substrate, etc. Edges 322, 324 are identified in FIG. 3, and one or more of such edges or other features (e.g., alignment marks, terminals, tips or other features of the contact structures 306) of the second substrate 302 can function as positional references.

As shown in FIG. 3, each contact structure 306 can comprise a post 308 (which can be a non-limiting example of an attachment portion of the contact structures 306), a beam 310 (which can be a cantilevered beam), and a contact tip structure 312, which can include a tip 350. (The tips 350 of the contact tip structures 312 in FIG. 3 are not visible, but the tip 350 of the contact tip structure 312 of one of the contact structures 306 in FIG. 3 is shown in dashed lines for purposes of illustration.) The contact structures 306 can be electrically conductive and can be configured as contacts for contacting an electronic component (not shown) to make electrical connections with the electronic component. As will be discussed below, the particular contact structures 306 illustrated in FIG. 3 are exemplary only, and many other types and configurations of contact structures can alternatively be used. For example, although four contact structures 306 are shown in FIG. 3, more or fewer contact structures 306 can be disposed on the second substrate 302.

As also shown in FIG. 3, a release layer 304 can be disposed between the contact structures 306 and the second substrate 302 to facilitate removing the contact structures 306 from the second substrate 302. The release layer 304 can be, for example, any material that can be removed without appreciably removing the contact structures 306. The release layer 304 can be, for example, a material that can be removed by dissolving or etching away the material. Alternatively, the release layer 304 can comprise an adhesive layer that can be released from substrate 302 by thermal action, ultra violet light, or other methods.

Figure 4A:
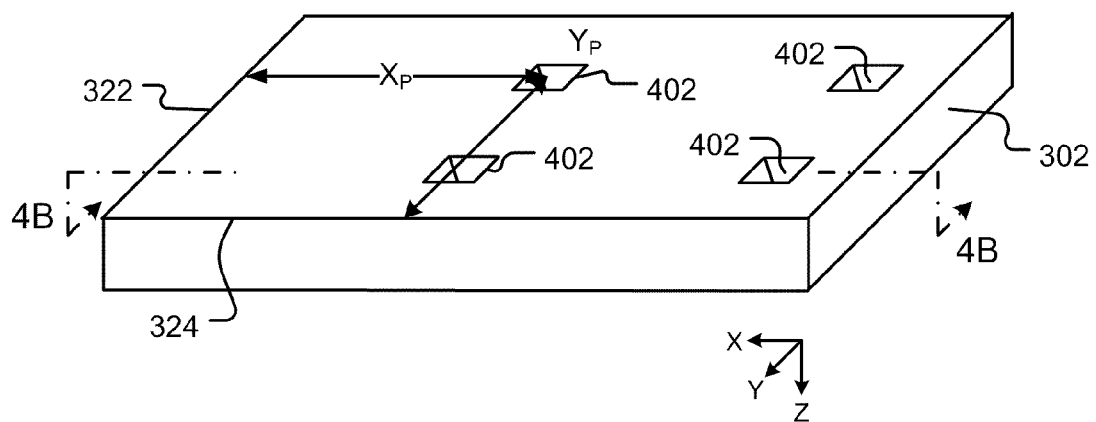
FIG. 4A shows a top perspective view and FIG. 4B shows a side, cross-sectional view of an exemplary second substrate with pits formed therein according to some embodiments of the invention.
Figure 4B:
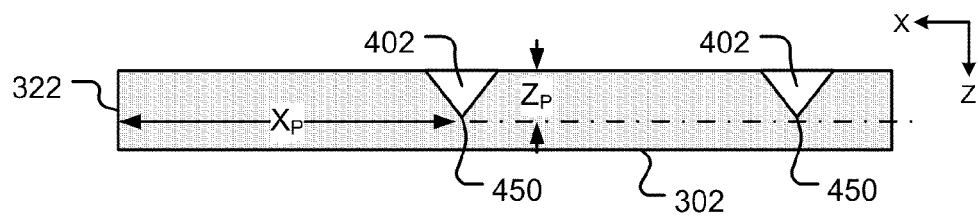

FIGS. 4A, 4B, 5A, and 5B illustrate a non-limiting, exemplary process of making the contact structures 306 of FIG. 2 according to some embodiments of the invention. FIGS. 4A and 4B show a top perspective view and a side cross-sectional view, respectively, of the second substrate 302. As shown, pits 402 can be etched, stamped, cut, or otherwise formed in the second substrate 302. As will be seen, the tips 350 of the contact tip structures 312 of the contact structures 306 of FIG. 3 can be formed in the pits 402. The pits 402 can therefore be formed in a shape that corresponds to a desired shape of the tips 350 of the contact tip structures 312, which can take any of many possible shapes. Each pit 402 can be formed and positioned such that a tip portion 450—which can correspond to a portion of the pit 402 at which a tip 350 of a contact tip structure 312 of a contact structure 306 is made—of the pit 402 is positioned distances $X_P$, $Y_P$ from edges 322, 324 (or other alignment features) of the second substrate 302, and as shown in FIG. 4B, the tip portion 450 of each pit 402 can further be positioned a depth $Z_P$ into the second substrate 302. Using photolithographic techniques, such as those used to make semiconductor dies, each pit 402 can be positioned with high precision (e.g., in some embodiments, each pit 402 can be made at a location in which distances $X_P$, $Y_P$ and depth $Z_P$ are accurate to within less than one micron). As mentioned, pits 402—and thus tips 350—can be positioned with respect to alignment features other than edges 322, 324. For example, an alignment feature or features (not shown) can be etched into or attached to substrate 302, and pits 402 can be positioned distances (e.g., $X_P$, $Y_P$) from edges of the alignment feature(s).

The pyramid shape of pits 402 (and consequently of contact tip structures 312) shown in FIGS. 4A and 4B is exemplary only; pits 402 can alternatively have other shapes including without limitation a truncated pyramid shape, an elongated blade shape, or any other shape. Thus, tip portions 450 of the pits 402 and tips 350 of the contact tip structures 312 need not be points but can have a flat feature, be a blade, or take other shapes. The release layer 304 (not shown in FIGS. 4A and 4B) can be deposited as a thin layer onto the sides and bottom of the pits 402. The release layer 304 can also be deposited over all or most of the upper surface (the surface into which pits 402 are formed) of the second substrate 302.

Figure 5A:
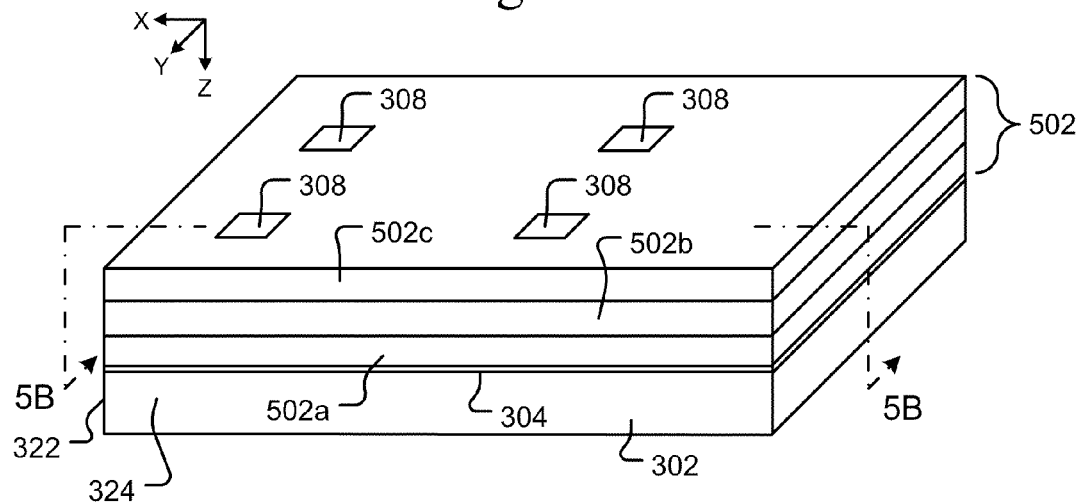
FIG. 5A shows a top perspective view and FIG. 5B shows a side, cross-sectional view of the second substrate of FIGS. 4A and 4B illustrating exemplary formation of contact structures on the second substrate according to some embodiments of the invention.
Figure 5B:
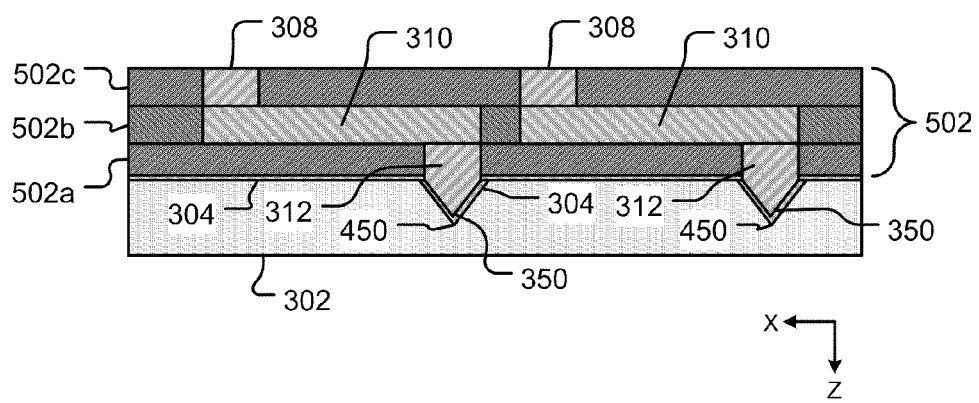

As shown in FIGS. 5A and 5B, the contact tip structures 312, beams 310, and posts 308 of the contact structures 306 can be formed in a plurality of layers 502 of a patternable material deposited onto the release layer 304 (which is shown in FIGS. 5A and 5B as a thin layer of material deposited over the second substrate 302 including into pits 402). For example, after the release layer 304 is deposited onto the surface of the second substrate 302 into which the pits 402 are formed, a first layer 502a of the patternable material can be deposited onto the release layer 304 and patterned to have openings (not shown) exposing the pits 402 and shaped to correspond to a desired shape of the contact tip structures 312. The contact tip structures 312, including tips 350, can then be formed by depositing material into the pits 402 and the openings (not shown) in the first layer 502a. The patternable material that forms the first layer 502a can be any material that can be deposited onto a substrate like substrate 302 and patterned to have openings. For example, the patternable material can be a material that can be selectively hardened or softened by exposure to light (e.g., a photoreactive material). A non-limiting example of such a material is a photo resist material. The patternable material need not be a material that can be selectively hardened or softened. For example, the patternable material can be a metal. The beams 310 can similarly be formed in openings (not shown) formed in a second layer 502b of the patternable material deposited onto the first layer 502a, and the posts 308 can be likewise formed in openings (not shown) formed in a third layer 502c of the patternable material deposited onto the second layer 502b. The layers 502 of patternable material can then be removed, which can result in the second substrate 302 with the contact structures 306 as shown in FIG. 3. If desired, the contact structures 306 can be formed in the openings in the layers 502 of patterned material by a variety of processing techniques. For example, portions or all of the contact structures 306 may be plated (e.g., using electroplating) as a part of the manufacturing process.

As mentioned, contact structures 306 are exemplary only, and other configurations, structures, etc. can be used. The process of making contact structures 306 shown in FIGS. 4A-5B is also exemplary only, and other processes of making such contact structures can be used. Regardless, of the particular configuration or structure of the contact structures 306, and regardless of how the contact structures 306 are made, many second substrates 302 with contact structures can be provided at 104 of the process 100 of FIG. 1.

Figure 6A:
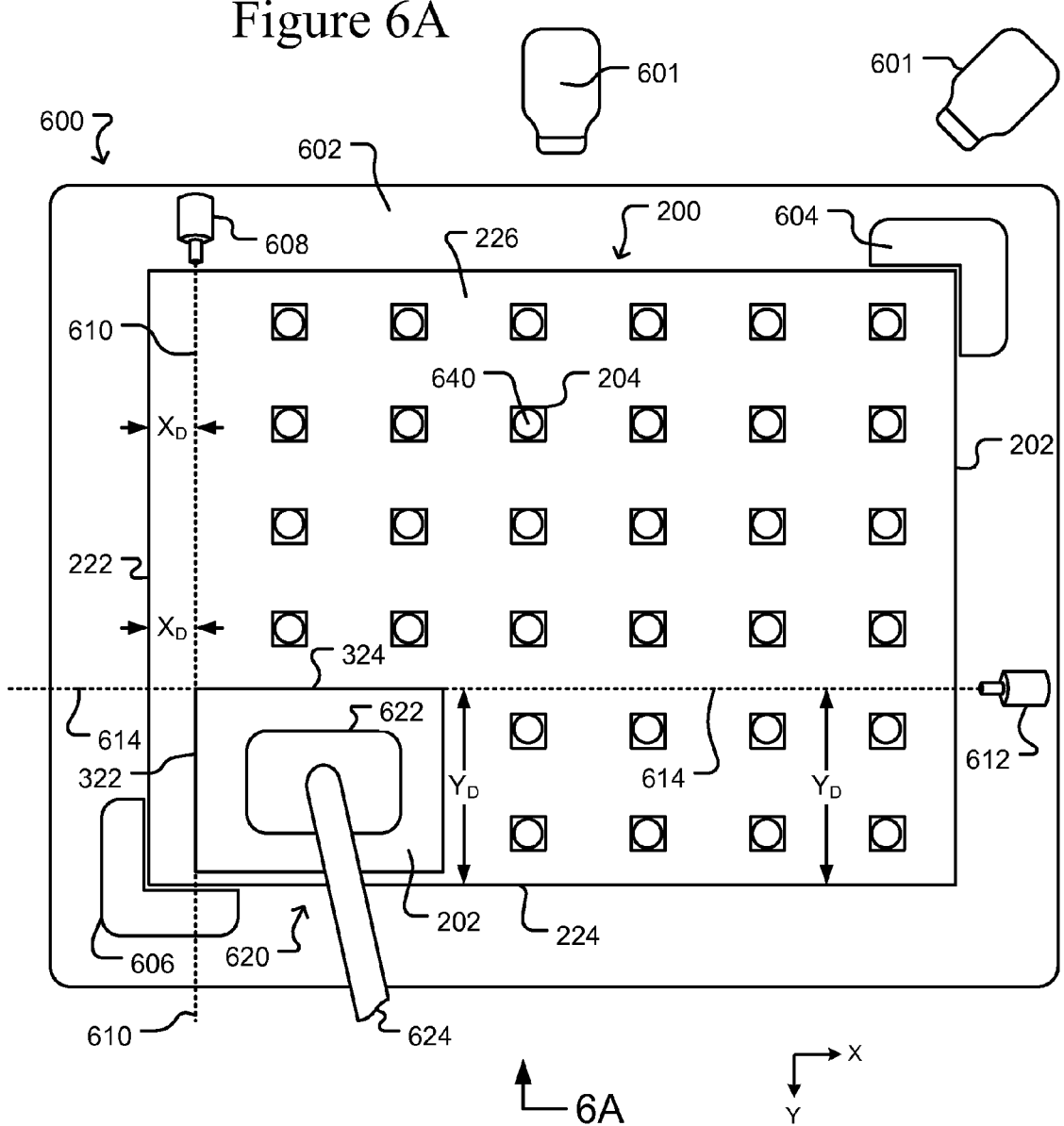
FIG. 6A shows a top view and FIG. 6B shows a side view of a system in which the second substrate of FIG. 3 can be positioned with respect to the first substrate of FIG. 2, and the contact structures attached to the second substrate can be attached to terminals of the first substrate according to some embodiments of the invention.
Figure 6B:
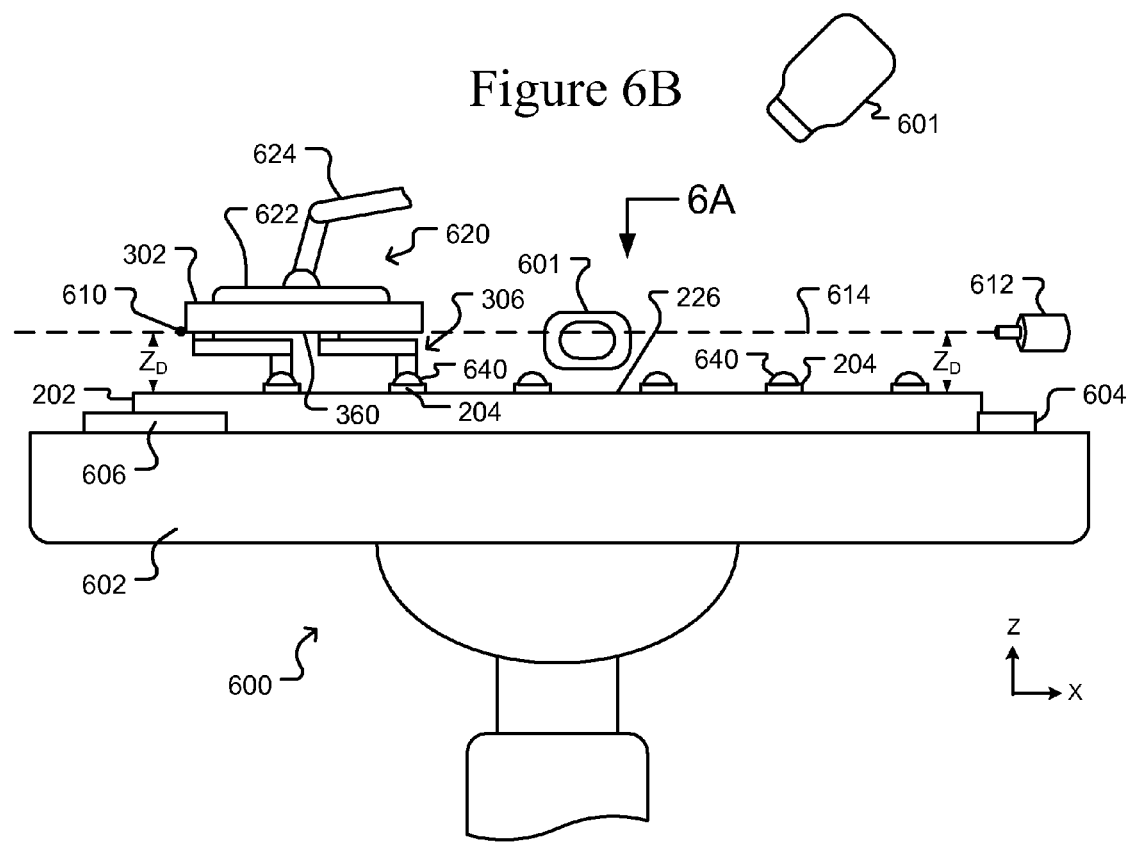

Referring again to FIG. 1, at 106, one of the second substrates 302 can be picked up and positioned (e.g., moved into an aligned position) with respect to the first substrate 202 of the device 200 of FIG. 2. FIGS. 6A and 6B illustrate a simplified, block diagram of a portion of an exemplary system that can be used to pick up one of the second substrates 302 and position the second substrate 302 with respect to the first substrate 202 according to some embodiments of the invention. Second substrates 302 may be placed according to a predetermined alignment pattern. For example, the alignment pattern may include repeatedly placing second substrates 302 onto the first substrate 202 separated by predetermined distances in one, two, or more directions.

As shown in FIGS. 6A and 6B, the system can include a stage 600 with a chuck 602. The stage 600 can be moveable. For example, the stage 600 can be moveable along one or more of the "x," "y," and "z" axes. The stage 600 can also be rotatable about one or more of the "x," "y," and "z" axes. As shown in FIGS. 6A and 6B, the first substrate 202 composing the device 200 can be placed on a surface of the stage 602. The stage 602 can include means by which the first substrate 202 can be held in position on the surface of the stage 602. Holding can be accomplished, for example, using vacuum force or mechanical clamping. For example, the stage 602 can include holding fixtures 604, 606 with cutouts shaped to receive a corner or other portion of the first substrate 202. Such holding fixtures 604, 606 can be moveable such that, for example, a corner of the first substrate 202 can be placed against one holding fixture (e.g., 606) and the other holding fixture (e.g., 604) can be moved against another corner of the first substrate 202, and the holding fixture (e.g., 604) can then be locked in place. Such holding fixtures 604, 606, or portions of such holding fixtures 604, 606, can optionally also function as location references.

The system shown in FIGS. 6A and 6B can also include a pick and place mechanism 620 (which can be a non-limiting example of a mechanical system) capable of picking up one of the second substrates 302 and moving the second substrate 302. For example, the pick and place mechanism 620 can include a grabbing mechanism 622 capable of picking up a second substrate 302 and a moveable arm mechanism 624 by which the grabbing mechanism 622—and a second substrate 302 picked up by the grabbing mechanism 622—can be moved along the "x," "y," and "z" axes and rotated about the "x," "y," and "z" axes. The grabbing mechanism 622 can pick up a second substrate 302 by creating a vacuum that holds the second substrate 302 against the grabbing mechanism 622. Alternatively, the grabbing mechanism 622 can include other means for picking up a second substrate 302. For example, the grabbing mechanism 622 can comprise a grasping tool. In some embodiments, the grabbing mechanism can comprise a mechanism 622 configured to pick and place semiconductor dies such as is known in the field. The moveable arm 624 can be any type of mechanical or robotic arm-like structure.

As generally shown in FIGS. 6A and 6B, the pick and place mechanism 620 can pick up one of the second substrates 302 and move the second substrate 302 into a position with respect to the first substrate 202 such that posts 308 of the contact structures 306 attached to the second substrate 302 generally align with terminals 204 on the first substrate 202. As also shown in FIGS. 6A and 6B, the system can include precision optical positioning mechanisms such as beam generating devices 608, 612 and/or optical imaging devices 601. The optical positioning mechanisms (e.g., the beam generating devices 608, 612 and/or optical imaging devices 601) can be used to position the second substrate 302 with respect to first substrate 202 and/or another second substrate 302 whose contact structures 306 have already been attached to terminals 204 of the first substrate 202.

In some exemplary embodiments, beam generators 608, 612 can be positioned such that the beams 610, 614 generated by the beam generators 608, 612 define an exact location for the second substrate 302. For example, as shown in FIGS. 6A and 6B, beam generators 608, 612 can be positioned such that beam 610 is located a distance $X_D$ from an edge 222 of the first substrate 202 and beam 614 is located a distance $Y_D$ from another edge 224 of the first substrate 202. Alternatively, distances $X_D, Y_D$ can be with reference to features other than edges 222, 224, such as, for example, other features of the first substrate 202 or features of the chuck 602 (e.g., holding fixtures 604, 606), which can correspond to one or more features on the first substrate 202. As shown in FIG. 6B, beams 610, 614 can similarly be positioned such that each is located a distance $Z_D$ from the first substrate 202. For example, the beams 610, 614 can be positioned a distance $Z_D$ from a surface 226 of the first substrate 202 on which the terminals 204 are disposed. Alternatively, distance $Z_D$ can be with reference to a feature or features other than the surface 226, such as, for example, other features of the first substrate 202 or features of the chuck 602, which can correspond to one or more features on the first substrate 202.

The pick and place mechanism 620 can be activated to move the second substrate 302 as needed to align the second substrate 302 with the beams 610, 614. For example, the pick and place mechanism 620 can translate the second substrate 302 along and rotate the second substrate 302 about one or more of the "x," "y," and "z" axes as needed to position the second substrate 302 to align with respect to the beams 610, 614. For example, as shown in the non-limiting example in FIGS. 6A and 6B, the pick and place mechanism 620 can translate the second substrate 302 along one or both of the "x" and "y" axes and/or rotate the second substrate 302 about the "z" axis until edge 322 of the second substrate 302 aligns with beam 610 and edge 324 aligns with beam 614. The pick and place mechanism 620 can also rotate the second substrate 302 about one or both of the "x" and "y" "x" axes and/or translate the second substrate 302 along the "z" axis until a surface 360 of the second substrate 302 from which the contact structures 306 extend aligns with beams 610, 614. In some non-limiting examples, that surface 360 of the second substrate 302 can be an outer surface of the release layer 304 (see also FIG. 3), although other reference surfaces or features can be used.

As should be apparent, by aligning edges 322, 324 and surface 360 of the second substrate 302 with beams 610, 614, the second substrate 302 can be positioned in the "x, y" plane (e.g., located distances $X_D, Y_D$ from alignment features in the form of edges 222, 224 of the first substrate 202), and the second substrate 302 can be oriented or planarized such that a surface (e.g., 360) or other portion of the second substrate 302 is located a distance $Z_D$ from an alignment plane (e.g., a surface 226 of the first substrate 202). Moreover, because the contact structures 306 can be positioned on the second substrate 302 with respect to edges 322, 324 of the second substrate 302 (see FIGS. 3A and 3B) as discussed above (e.g., tips 350 of the contact tip structures 312 of each contact structure 306 can be positioned with respect to edges 322, 324 of the second substrate 302 as shown in FIGS. 3A and 3B), aligning the second substrate 302 with respect to the first substrate 202 can also align the tips 350 of the contact tip structures 312 of the contact structures 306 attached to the second substrate 302 with respect to the first substrate 202 or with respect to another positional reference.

The beam generators 608, 612 can be lasers, and beams 610, 614 can be laser beams. As another example, beam generators 608, 612 can be autocollimators or an interferometrics apparatus. The cameras 601 can be high resolution cameras that generate high resolution images of the top (e.g., the view shown in FIG. 6A) and side (e.g., the view shown in FIG. 6B) of the chuck 602, first substrate 202, and second substrate 302 as well as the beams 610, 614. The cameras 601 can thus produce high resolution images of the beams 610, 614 and the second substrate 302, and the pick and place mechanism 620 can move the second substrate 302 until edges 322, 324 (or other alignment features) of the second substrate 302 align with the beams 610, 614 as discussed above.

Figure 7:
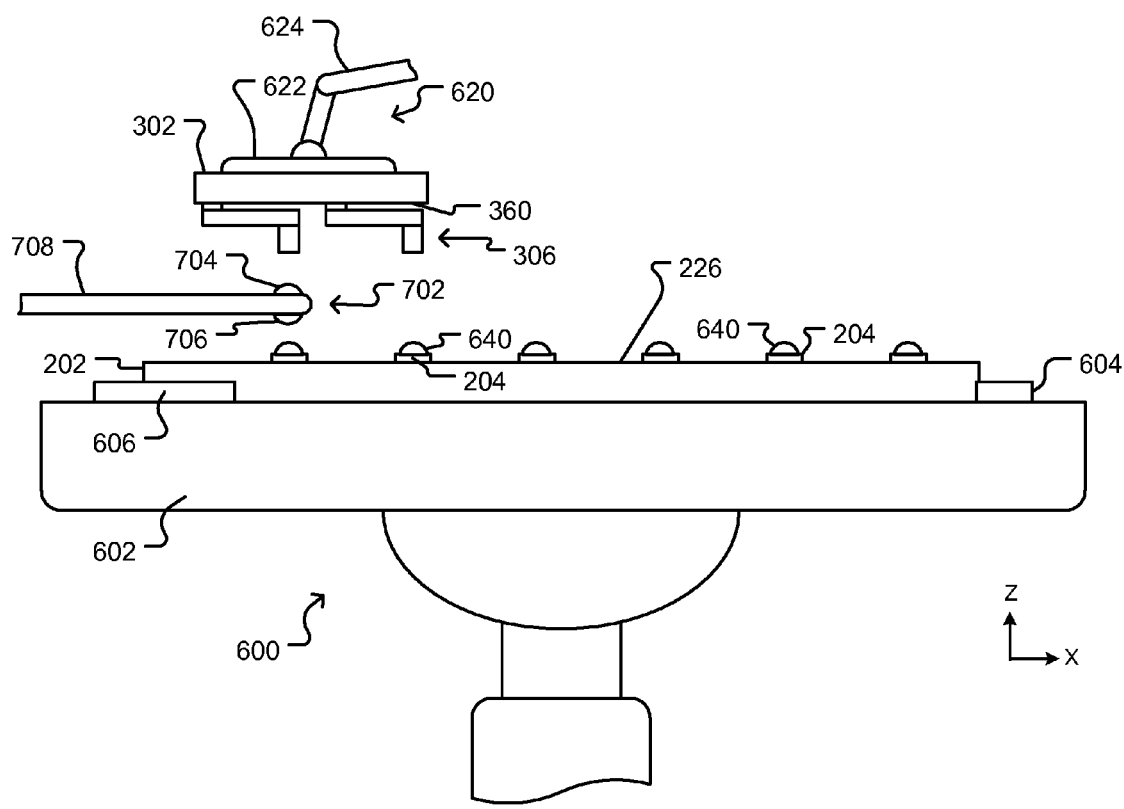
FIG. 7 illustrates an alternative system for positioning the second substrate of FIG. 3 with respect to the first substrate of FIG. 2.

Alternative arrangements of optical positioning mechanisms can be used as well. For example, as illustrated in FIG. 7, an optical alignment assembly 702 having upward looking camera 704 and downward looking camera 706 attached to an arm 708 can be inserted between the first substrate 202 and the second substrate 302. The pick and place mechanism 620 and the stage 600 may be moved sufficiently far apart to allow insertion of the optical alignment assembly 702. The first substrate 202 and second substrate 302 may then be brought into alignment by using the upward looking camera 704 and downward looking camera 706 to position features thereof to bring the substrates into alignment. Any and all of the stage 600, pick and place mechanism 620, and optical alignment assembly 702 may be moved during the alignment process. For example, in some embodiments, the stage 600 may move in an x and y direction, and the pick and place mechanism 620 may move in one or more of x, y and z directions and rotate about one or more of x, y and z axes. It is understood that other combinations of movements may also be provided for one or more of the stage 600, the pick and place mechanism 620, and the optical alignment assembly 702 if desired. Following alignment in the x and y directions, the optical alignment assembly 702 may be removed from between the substrates 202 and 302 and the z alignment can be performed using other measurement techniques, such as described above.

Figure 8:
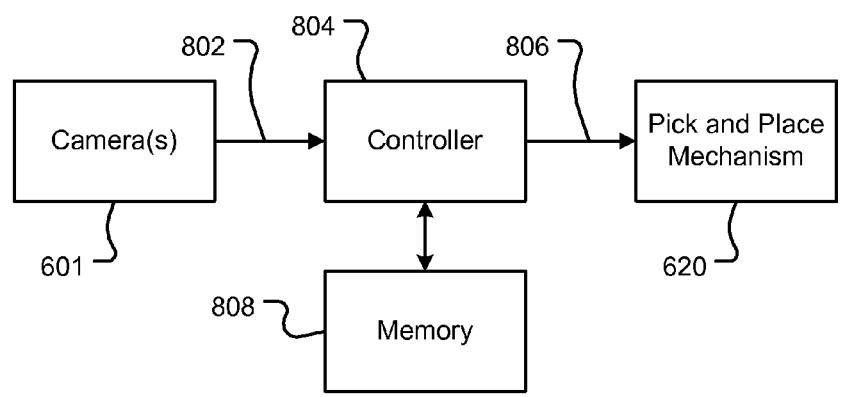
FIG. 8 illustrates an exemplary control system for controlling the system of FIGS. 6A and 6B according to some embodiments of the invention.

Referring to FIG. 8, in some embodiments, high resolution digital images from cameras 601 (or, 704, 706) can be input 802 into a processor/controller 804, which can be a digital microprocessor, computer, or other electronic digital processing device. For example, the processor/controller 804 can be operated in whole or in part in accordance with software (which can include microcode and/or firmware) stored in a digital memory 808. The processor/controller 804 can process the digital images and output control signals 806 for controlling movement of the pick and place mechanism 620. For example, the processor/controller 804 can identify in the digital image data input 802 from the cameras 601 (or 704, 760) edges 322, 324 (or other alignment features) of the second substrate 302 and the beams 610, 614. The processor/controller 804 can output control signals 806 that cause the pick and place mechanism 620 to move (e.g., translate along the "x" and/or "y" axes and/or rotate about the "z" axis) the second substrate 302 until edges 322, 324 (or other alignment features) of the second substrate 302 align with the beams 610, 614 as discussed above. The processor/controller 804 can also output control signals 806 that cause the pick and place mechanism 620 to move (e.g., rotate about the "x" and/or "y" axes and/or translate along the "z" axis) the second substrate 302 until surface 360 (or other alignment features) of the second substrate 302 also align with the beams 610, 614 as discussed above. The processor/controller 804 can thus monitor the current position of the second substrate 302 with respect to the beams 610, 614 and, while continuing to monitor the changing position of the second substrate 302, move the second substrate 302 into alignment with the beams 610, 614 as discussed above. The second substrate 302 and the contact structures 306 of the second substrate 302 can thus be positioned with respect to the first substrate 202 or other positional references. Although not shown in FIG. 8, the processor/controller 804 can also output control signals 806 to control (e.g., position, turn on or off, etc.) beam generators 608, 612.

The system shown in FIGS. 6, 7, and 8 is exemplary only and many variations are possible. For example, more than two beam generators 608, 614 can be used, and thus, the second substrate 302 can be aligned to more than two beams 610-612. In some embodiments, beam generators 608, 612 need not be used, and the second substrate 302 can be aligned to features other than beams. For example, utilizing high resolution images from the cameras 601, the processor/controller 804 can identify in the image edges 222, 224 (or other features) of the first substrate 202 and edges 322, 324 (or other features) of the second substrate 302. The processor/controller 804 can then control movement of the pick and place mechanism 620 to align the edges 322, 324 of the second substrate 302 to be distances from the edges 222, 224 of the first substrate 202. As another example of a variation of the system shown in FIGS. 6A, 6B, 7, and 8, more or fewer than two cameras 601 can be used.

As yet another example of a variation of the system shown in FIGS. 6A, 6B, 7, and 8, beam generating devices 608, 610, 612, 614 need not be used. Rather, the positions of one or more alignment features on the first substrate 202 and one or more alignment features on the second substrate 302 can be determined, for example, using optical imaging devices 601, and one or both of the first substrate 202 and/or the second substrate 302 can be moved using a precision moving device to align the alignment feature(s) of the second substrate 302 with respect to the alignment feature(s) of the first substrate 202. For example, optical imaging devices 601 can be used to generate digital images of the first substrate 202 and the second substrate 302. A precision stepper motor can then be used to move the first substrate 202 and/or the second substrate 302 until the second substrate 302 is aligned as determined from the generated digital images with the first substrate 202 and/or a previously positioned second substrate 302. For example, a precision stepper motor can move stage 600 (on which the first substrate 202 is disposed) and/or the pick and place mechanism 620 (which holds the second substrate 302).

Figure 9:
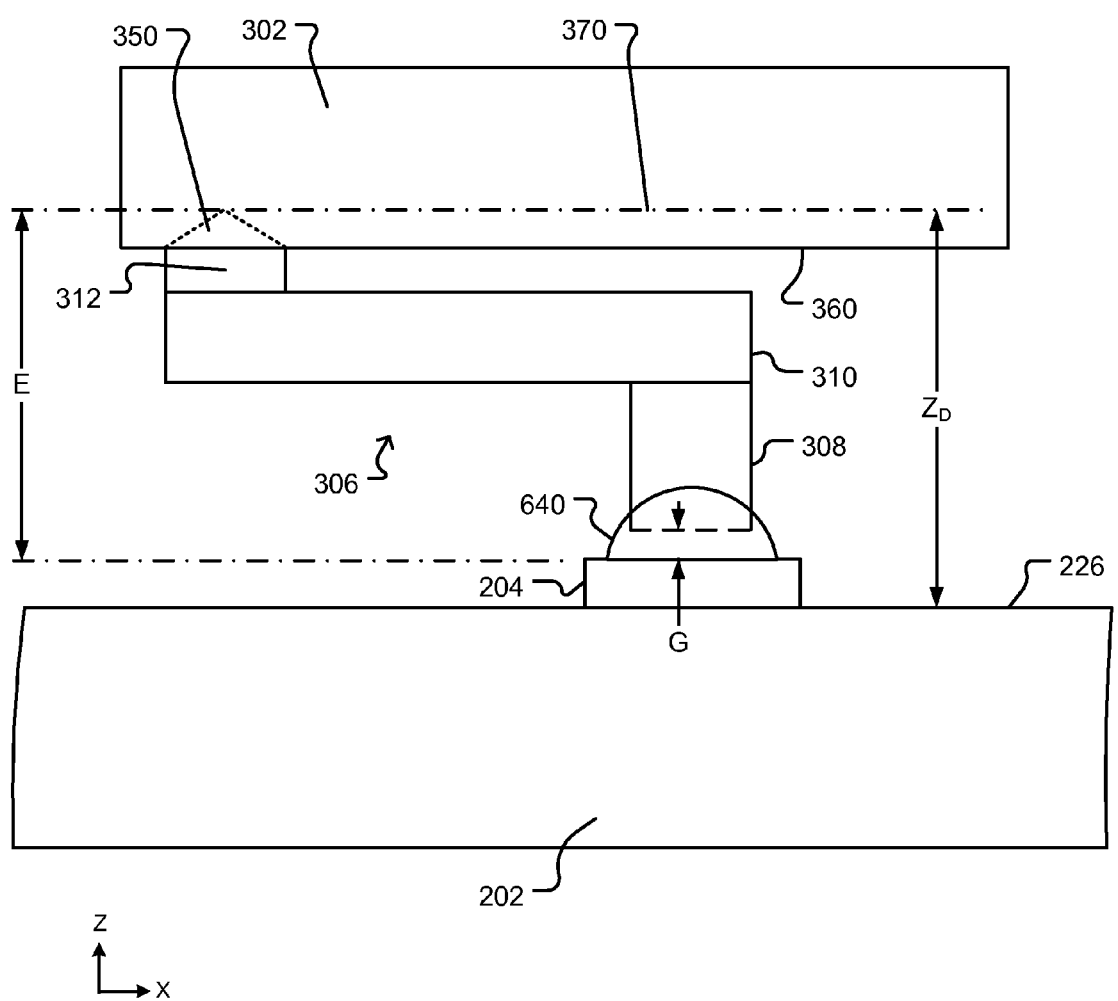
FIG. 9 shows a side view of a contact structure and portions of the second substrate and first substrate.

Referring again to FIG. 1, at 108, the contact structures 306 on the second substrate 302 can be attached to terminals 204 of the first substrate 202. In some embodiments of the invention, a flowable joining material can be used to secure posts 308 of the contact structures 306 to terminals 204 of the first substrate 202. A flowable joining material can be a material that is solid at room temperature but has a sufficiently low melting temperature to be readily melted within a desired temperature range. Solder is a non-limiting example of a suitable flowable joining material. Conductive epoxy can be another example of a flowable joining material. Referring again to FIGS. 6A and 6B, flowable joining material 640 (e.g., solder, a conductive epoxy, other adhesive, etc.) can be disposed on the terminals 204 by, for example, stencil printing. The flowable joining material 640 can be melted, and as shown in FIG. 9, the positioning of the second substrate 302 with the pick and place mechanism 620, as described at step 108 of FIG. 1, can result in posts 308 of the contact structures 306 being placed in melted flowable joining material 640. As also shown in FIG. 9, which shows a close up view of one of the contact structures 306, a post 308 of a contact structure 306 need not rest on a terminal 204. Rather, as shown in FIG. 9, there can be a gap G between a post 308 and a terminal 204. Such a gap G can compensate for contact structures 306 whose extension E from the tip 350 to the bottom of the base 308 plus the height of the terminal 204 is different (e.g., less) than the desired distance $Z_D$ from the surface 226 of the first substrate 202 to a desired plane 370 for the tips 350 of the contact structures 306. The gap G can be the difference between (E plus the height of the terminal 204) and $Z_D$. The gap G can also compensate for inaccuracies or variations from terminal 204 to terminal 204 in the height of terminal 204 from the surface 226 of the first substrate 202 (e.g., due to manufacturing variations), or the height of the terminal 204 relative to the chuck 202 (e.g, due to warpage of the first substrate 202). The second substrate 302 can be held in alignment with beams 610, 614 as described above, until the melted flowable joining material 640 re-solidifies.

Although not shown, the flowable joining material 640 can be placed first on the ends of the posts 308 rather than on the terminals 204. As yet another alternative, the flowable joining material 640 can be placed on both the ends of the posts 308 and the terminals 204. Regardless of where the flowable joining material 640 is placed, once the solder is melted and re-solidified around posts 308 of the contact structures 306, the contact structures 306 are attached to terminals 204 of the first substrate 202. As noted above, flowable joining material 640 is but one example of a flowable joining material; other electrically-conductive flowable joining materials can be used in place of flowable joining material 640.

Referring again to FIG. 1, the picking and positioning at 106 and the attaching at 108 can be repeated one or more times, generally as described above. Additional contact structures 306 on one or more additional second substrates 302 can thus be attached to others of the terminals 204 of the first substrate 202.

For example, the optical imaging device 601 of FIGS. 6A and 6B or the optical alignment assembly 702 of FIG. 7 may be used to align the first substrate 202 and a second substrate 302. Other second substrates 302 can then be aligned using predetermined offsets from where the first one of the second substrates had been positioned. As another example, the optical imaging device 601 of FIGS. 6A and 6B or the optical alignment assembly 702 of FIG. 7 may be used to align all or subsets of the second substrates 302. For example, while positioning second substrates 302 onto the first substrate 202, the pick and place mechanism 620 may periodically be separated from the chuck 602 sufficiently to allow the interposition of the optical alignment assembly 702.

Figure 10:
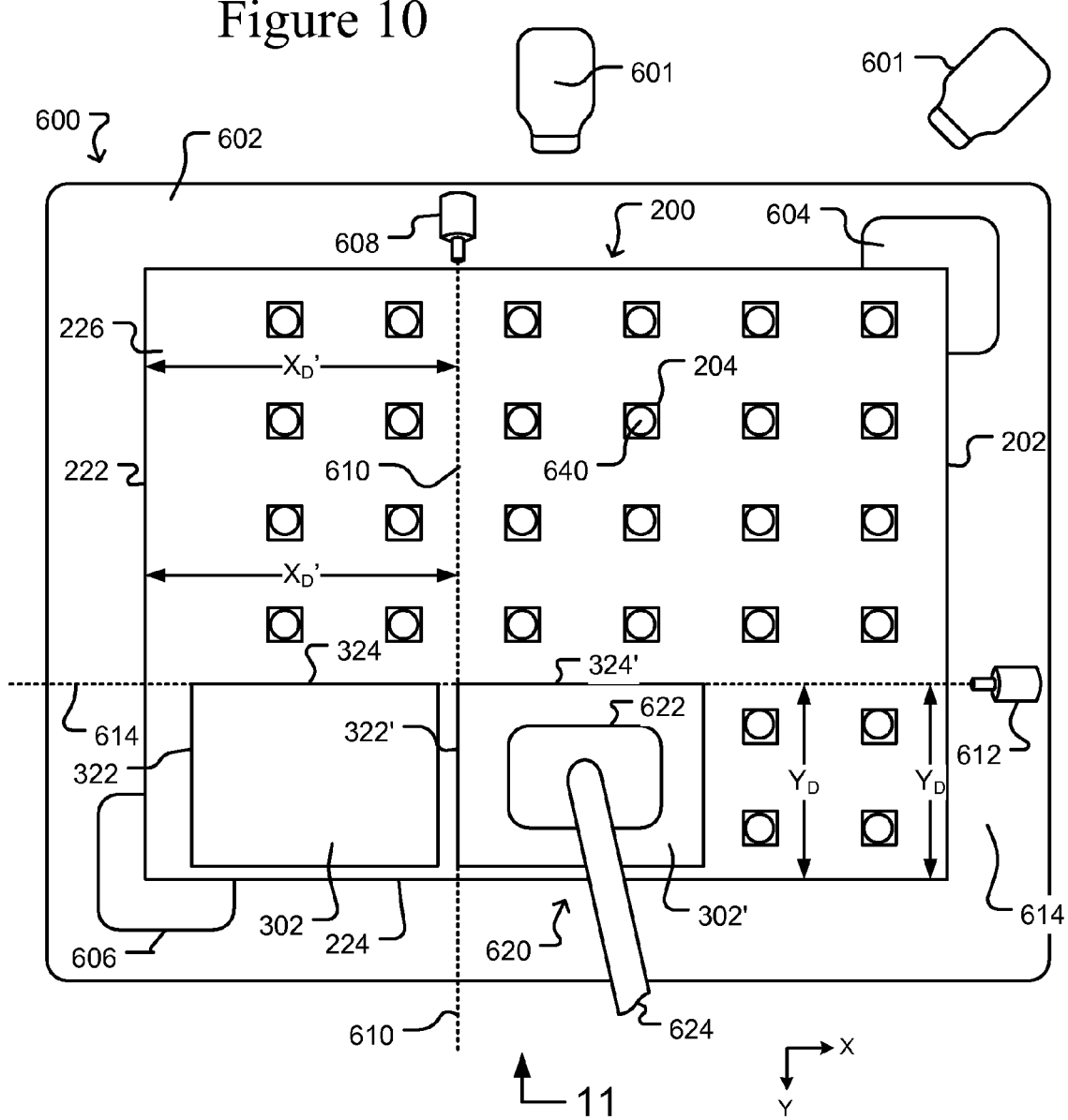
FIG. 10 shows a top view and FIG. 11 shows a side view of the system of FIGS. 6A and 6B in which another of the second substrates of FIG. 3 can be positioned with respect to the first substrate of FIG. 2 or the other second substrate shown in FIGS. 6A and 6B, and the contact structures attached to the another of second substrates can be attached to terminals of the first substrate according to some embodiments of the invention.
Figure 11:
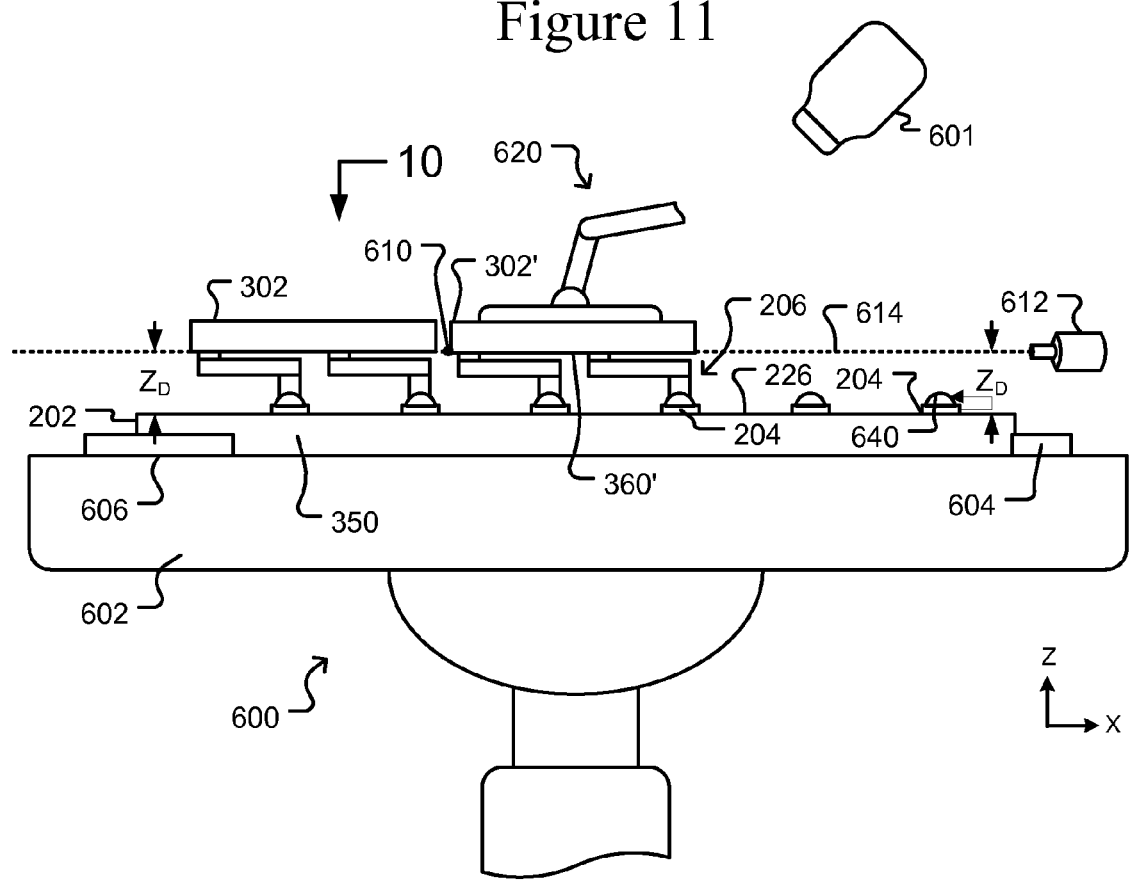

FIGS. 10 and 11 illustrate another technique for exemplary attachment of another second substrate 302' to another set of terminals 204. The position of one or both of the beams 610, 614 generated by beam generators 608, 612 can be changed to define a different position (e.g., an aligned position) for the other second substrate 302'. In the example shown in FIGS. 10 and 11, the position of beam 610 can be changed and can be positioned a distance $X_D'$ from the edge 222 of the first substrate 202. In the example shown in FIGS. 10 and 11, the position of beam 614 can be unchanged and can thus remain a distance $Y_D$ from edge 224 of the first substrate 202. Both beams 610, 614 can remain positioned a distance $Z_D$ from surface 226 of the first substrate 202.

The pick and place mechanism 620 can position the other second substrate 302' such that edge 322' aligns with beam 610 and edge 324' aligns with beam 612 generally as discussed above with respect to FIGS. 6-9. The pick and place mechanism 620 can also position second substrate 302' such that surface 360' is a uniform distance $Z_D$ from surface 226 of the first substrate 202 as also generally discussed above with respect to FIGS. 6-9. Rather than positioning beams 610, 614—and thus substrate 302'—with respect to features of the first substrate 202 (e.g., edges 222, 224 and surface 226), beams 610, 614 can be positioned with respect to features of the second substrate 302 previously positioned and attached. For example, the $X_D$ and $Y_D$ distances in FIG. 10 can be with respect to edges 322, 324 of second substrate 302 rather than edges 222, 224 of first substrate 202. Generally as discussed above, once the melted flowable joining material 640 into which the posts 308 of contact structures 306 extending from the second substrate 302' have re-solidified, those posts 308 are attached to the terminals 204 of the first substrate 202. The picking and position at 106 and attaching at 108 of the process 100 of FIG. 1 can then be repeated until a desired number of contact structures 306 have been attached to terminals 204 of the first substrate 202.

All of the contact structures 306 attached to terminals 204 of the first substrate 202 can then be released from the second substrates 302, 302' at 110 of the process 100 of FIG. 1. For example, as generally discussed above, the contact structures 306 can be released from the second substrates 302, 302' by removing the release layer 304 on each second substrate 302, 302' as generally discussed above. The result can be the device 1200 with a large group of contact structures 306 attached to terminals 204 of the first substrate 202 as generally shown in FIGS. 12A, 12B, and 12C.

Figure 12A:
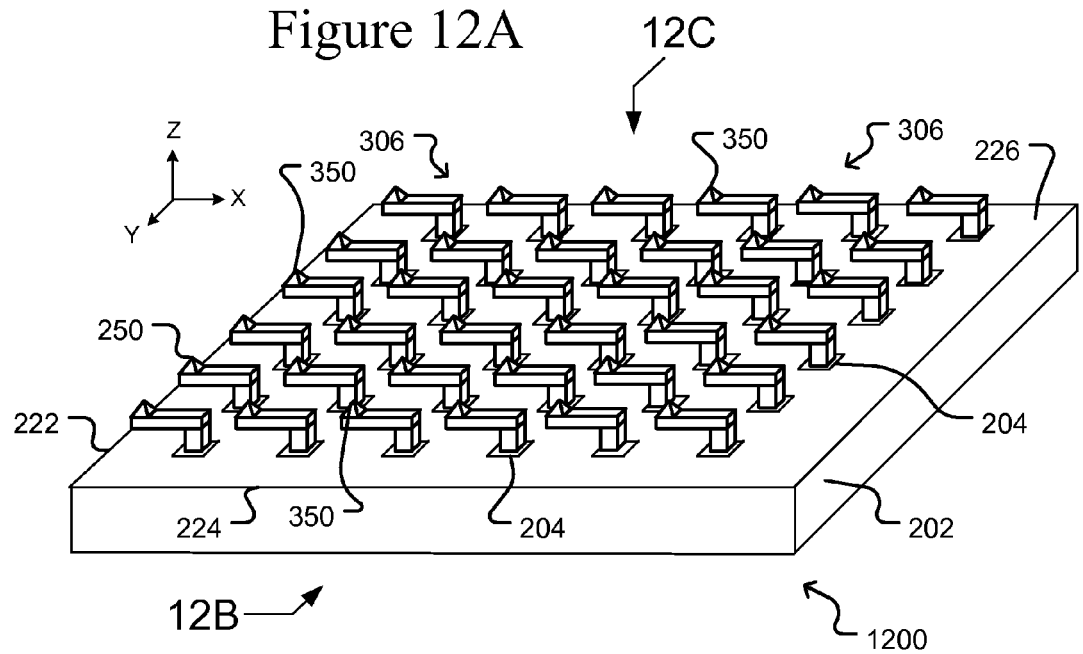
FIG. 12A shows a top, perspective view.
Figure 12B:
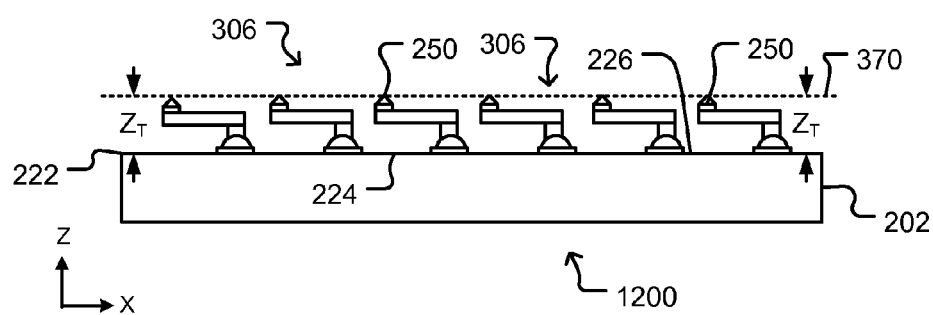
FIG. 12B shows a side view.

The large group of contact structures 306 shown attached to terminals 204 of the first substrate 202 in FIGS. 12A, 12B, and 12C can be the result of positioning and attaching several second substrates 302, 302' (e.g., nine in the example shown in FIGS. 6-12B, although more or fewer can be positioned and attached in other examples) in accordance with the process 100 of FIG. 1. As discussed above, the use of high precision optical systems, such as beam generators 608, 612, cameras 601, and a digital processor/controller 804, can result in each second substrate 302 being placed in the "x, y" plane to within at least one micron precision, and the planarity of each second substrate 302 can be oriented or planarized to the "x, y" plane ($Z_D$ in FIG. 11 can be uniform) to within at least one micron precision. For example, the edges 322, 322' of each second substrate 302, 302' can be positioned within the "x, y" plane to within one micron or less of the desired distances $X_D$, $X_D'$, and $Y_D$ (see FIGS. 6, 7, 10, and 11), and the surface 360, 360' of each second substrate 302 can be oriented or planarized such that the entire surface 360, 360' of each second substrate 302 is within one micron or less of the desired distance $Z_D$ (see FIGS. 6, 7, 10, and 11).

Because of the foregoing positioning of each of the second substrates 302, 302' whose contact structures 306 are attached to the terminals 204 of the first substrate 202 and the positioning of the formation of tips 350 of the contact tip structures 312 of the contact structures 306 on the second substrates 302 (see FIGS. 4A and 4B above), the tips 350 of each of the contact structures 306 attached to the first substrate 202 in FIGS. 12A, 12B, and 12C can be correspondingly positioned within a desired plane. For example, the position in the "x, y" plane with respect to a common reference of each tip 350 in the group of contact structures 306 attached to the second substrate 202 in FIGS. 12A, 12B, and 12C can be to within one micron. Referring to FIG. 12C, for example, the distances $D_{P1}$, $D_{P2}$ between the tips 350 of every pair of adjacent contact structures 306 in the group attached to the second substrate 202 in FIGS. 12A, 12B, and 12C can be the same to within one micron. For example, for every possible set of two pairs of adjacent contact structures 306 in FIG. 12C, $D_{P1}$ and $D_{P2}$ can be within one micron of each other. Referring to FIG. 12B, the distance $Z_T$ from a reference surface (e.g., surface 226 of the second substrate 202) to each tip 350 in the group of contact structures 306 attached to the first substrate 202 in FIGS. 12A, 12B, and 12C can be to within one micron. Thus, for example, the tips 350 of every contact structures 306 in the group attached to the first substrate 202 in FIGS. 12A, 12B, and 12C can be within one micron of a desired plane (e.g., represented by line segment 370 in FIG. 12B, which defines a plane extending into and out of the page of FIG. 12B) that is generally parallel to the surface 226 of the first substrate 202.

In some embodiments, reference surface 226 need not be planar but can have a curved contour. Alternatively or in addition, the plane represented by line segment 370 in FIG. 12B can alternatively be non-planar (e.g., a curved contour).

Although thirty-six contact structures 306 are shown in the group of contact structures 306 attached to the first substrate 202 in FIGS. 12A, 12B, and 12C, more or fewer contact structures 306 can be attached to the first substrate 202 in other examples. Moreover, groups of fifty, one hundred, five hundred, one thousand, or more contact structures 306 can be attached to the first substrate 202 as shown in FIGS. 12A, 12B, and 12C and the one-micron tolerances discussed above can be achieved for groups of fifty, one hundred, five hundred, one thousand or more contact structures 306. Such large groups of contact structures 306 with tips 350 within one micron of a reference plane (e.g., plane 370) can be beneficial for any number of reasons. For example, the planar orientation of the tips 350 can closely match the planar orientation of terminals (not shown) of another electronic device (not shown) that the tips 350 are configured to contact and thereby make electrical connections with. The closer the planar orientation of the tips 350 matches the planar orientation of such terminals (not shown) of another electronic device (not shown), the more uniform the force applied by each contact structure 306 against a correspond terminal (not shown) of the another electronic device (not shown) can be. This can result in, for example, generally uniform scrub marks (not shown) made by the tips 350 of the contact structures 306 on the terminals (not shown) of the another electronic device (not shown).

Figure 13:
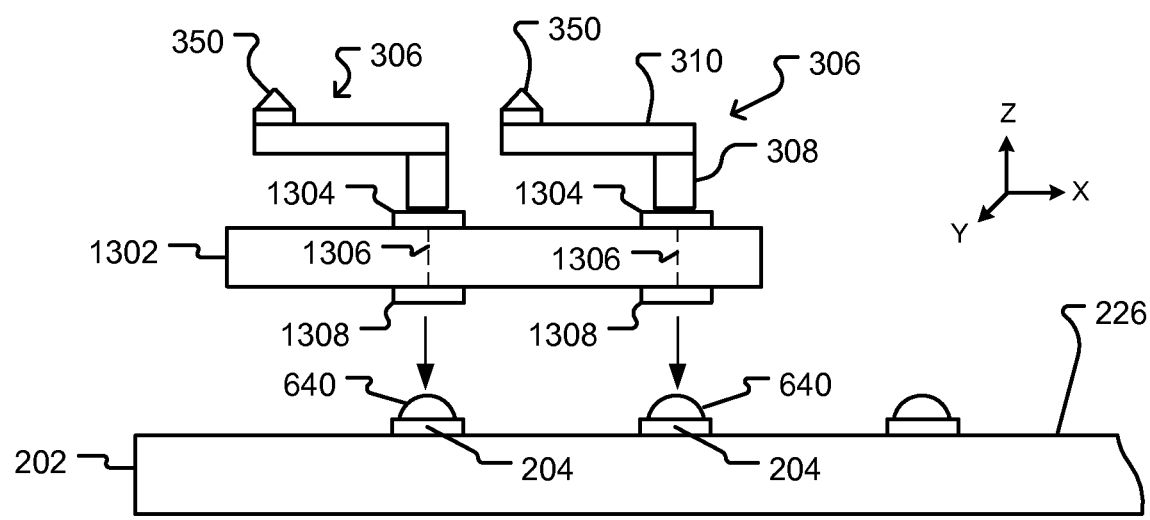
FIG. 13 illustrates a variation of the process of FIG. 1 in which a substrate with contact structures is aligned with and attached to the first substrate.

The process 100 shown in FIG. 1 is exemplary only and many variations and modifications are possible. FIG. 13 illustrates an example of such a variation. In FIG. 13, contact structures 306 can be formed on or attached (e.g., adhered by solder, a conductive epoxy, or other adhesive) to terminals 1304 (which can be non-limiting examples of second terminals) of substrate 1302, which can be a non-limiting example of a second substrate. Terminals 1304 (which can be on a first surface of substrate 1302) can be electrically connected by electrical connections 1306 (e.g., vias and/or traces on and/or through substrate 1302) to terminals 1308 on an opposite side (which can be a second surface) of substrate 1302. Substrate 1302 can be positioned with respect to first substrate 202 using any of the positioning techniques discussed herein with respect to positioning second substrate 302 with respect to first substrate 202. In some embodiments, the alignment feature or features of substrate 1302 can be the tips 350 of contact structures 306. Terminals 1308 (which can be non-limiting examples of third terminals) can then be attached (e.g., with flowable joining material 640 non-limiting examples of which can be solder, a conductive adhesive, or other adhesives) to terminals 204 (which can be non-limiting examples of first terminals) of first substrate 202. After attaching terminals 1308 to terminals 204. contact structures 306 are not released from substrate 1302, nor is substrate 1302 removed. Rather, substrate 1302 can remain attached to first substrate 202. Multiple substrates 1302 can be attached to first substrate 202 to form large arrays of contact structures 306 (e.g., as shown in FIGS. 12A-12C). As mentioned, contact structures 306 can be formed on and thereby attached to terminals 1304. Alternatively, contact structures 306 can be adhered to terminals 1304, for example, with solder, a conductive epoxy, or other adhesives. As also mentioned, flowable material 640 by which terminals 1308 and 204 are joined can be solder, a conductive epoxy, or other adhesives.

As another example of a variation of the process 100 of FIG. 1, there can be some overlap in the performance of one or more of the elements 102, 104, 106, 108 of the process 100 shown in FIG. 1. In some embodiments of the invention, for example, there can be overlap in the performance of elements 106 and 108. In such embodiments, the chuck 602 can be heated (see FIGS. 6A and 6B) to raise the temperature of the flowable joining material 640 to a temperature that is close to but less than the melting temperature of the flowable joining material 640. (Chuck 602 can thus be a non-limiting example of a temperature controlled chuck.) For example, the chuck can be heated to a temperature that heats the flowable joining material 640 to a temperature that is within twenty percent, ten percent, five percent, or less than the melting temperature of the flowable joining material 640. The chuck 602 can be heated, for example, by a heater (not shown) built into the chuck 602 or by external heating means. At 106, a second substrate 302 can be picked up by the pick and place mechanism 620, and the posts 308 of the contact structures 306 extending from the second substrate 302 can be pressed against flowable joining material 640 on ones of the terminals 204 to which the posts 308 are to be attached. The pick and place mechanism 620 can then be heated (e.g., by a heater (not shown) embedded in or other wise connected to the grabbing mechanism 622), which can heat the contact structures 306 and the flowable joining material 640 against which the posts 308 of the contact structures 306 are pressed past the melting temperature of the flowable joining material 640. Optionally, a gas can be dispensed over the second substrates 302, 302' and around the contact structures 306 while effecting the melting and re-solidifying of the flowable joining material 640. As is known, the presence of a gas can aid formation of strong solder joints with high electrical conductivity.

Once the flowable joining material 640 against which the posts 308 are placed melts, the pick and place mechanism 620 can then move the second substrate 302 to align the second substrate 302 with the beams 610, 614 as described above. This can result in the posts 308 being partially enveloped by corresponding flowable joining material 640 as generally shown in FIG. 9. Once the second substrate 302 is aligned (e.g., in an aligned position) as discussed above, the heating of the pick and place mechanism 620 can be turned off, which can cause the temperature of the melted flowable joining material 640 to drop below the melting temperature of the solder. The flowable joining material 640 can thus re-solidify, securely attaching the posts 308—and thus the contact structures 306—to terminals 204. Once the flowable joining material 640 has re-solidified, the pick and place mechanism 620 can release the second substrate 302.

It should be noted that the foregoing process of melting flowable joining material 640—heating all of the flowable joining material 640 on the terminals 204 of the second substrate 202 to a temperature that is close to but less than the melting temperature of the flowable joining material 640 and then raising the temperature of the flowable joining material 640 against which posts 308 are pressed by heating the pick and place mechanism 620 holding a second substrate 302—can result in controlled melting of only the flowable joining material 640 against which the posts 308 are pressed. That is, only the flowable joining material 640 against which the posts 308 are being pressed melt, and all other flowable joining material 640 on terminals 204 of the second substrate 202 does not melt. Thus, flowable joining material 640 on terminals 204 to which posts 308 of contact structures 306 have already been attached (e.g., during prior performance of 106, 108 in the process 100 of FIG. 1) are not melted nor is flowable joining material 640 on terminals 204 to which no posts 308 have yet been attached.

In some embodiments, where the first substrate 202 has a first coefficient of thermal expansion, and the second substrates 302 have a second coefficient of thermal expansion different than the first coefficient of thermal expansion, the temperature to which the chuck 602 heats the first substrate 202 and the temperature to which the pick and place mechanism 620 heats the second substrate 302 can be selected such that the first substrate 202 and the second substrates 302 expand by the same or approximately the same distance. For example, the temperature to which the first substrate 202 is heated by the chuck 602, and the temperature to which the second substrates 302 are heated by the pick and place mechanism 620 can be selected such that $T_1 * C_1$ equals or approximately equals $T_2 * C_2$, where $T_1$ is the temperature to which the chuck 602 heats the first substrate 202 and $C_1$ is the coefficient of thermal expansion of the first substrate 202 in unit length divided by unit temperature; $T_2$ is the temperature to which the pick and place mechanism 620 heats the second substrates 302, 302' and $C_2$ is the coefficient of thermal expansion of the second substrates 302, 302' in unit length divided by unit temperature; and * represents multiplication.

Other variations of the process 100 of FIG. 100 are also possible. For example, additional actions may be taken. In some embodiments, once contact structures 306 are attached to terminals 204 of the first substrate 202, the positions of one or more of the tips 350 can be adjusted by bending the beam or beams 310 to which the contact tip structures 312 of the one or more tips 350 are attached. For example, a beam 310 can be grasped with a grasping tool and bent toward or away from the surface 226 of the first substrate. In addition, one or more damaged or defective contact structures 306 attached to terminals 204 of the second substrate 302 can be removed and replaced with replacement contact structures that can be similar to contact structures 306.

Figure 14:
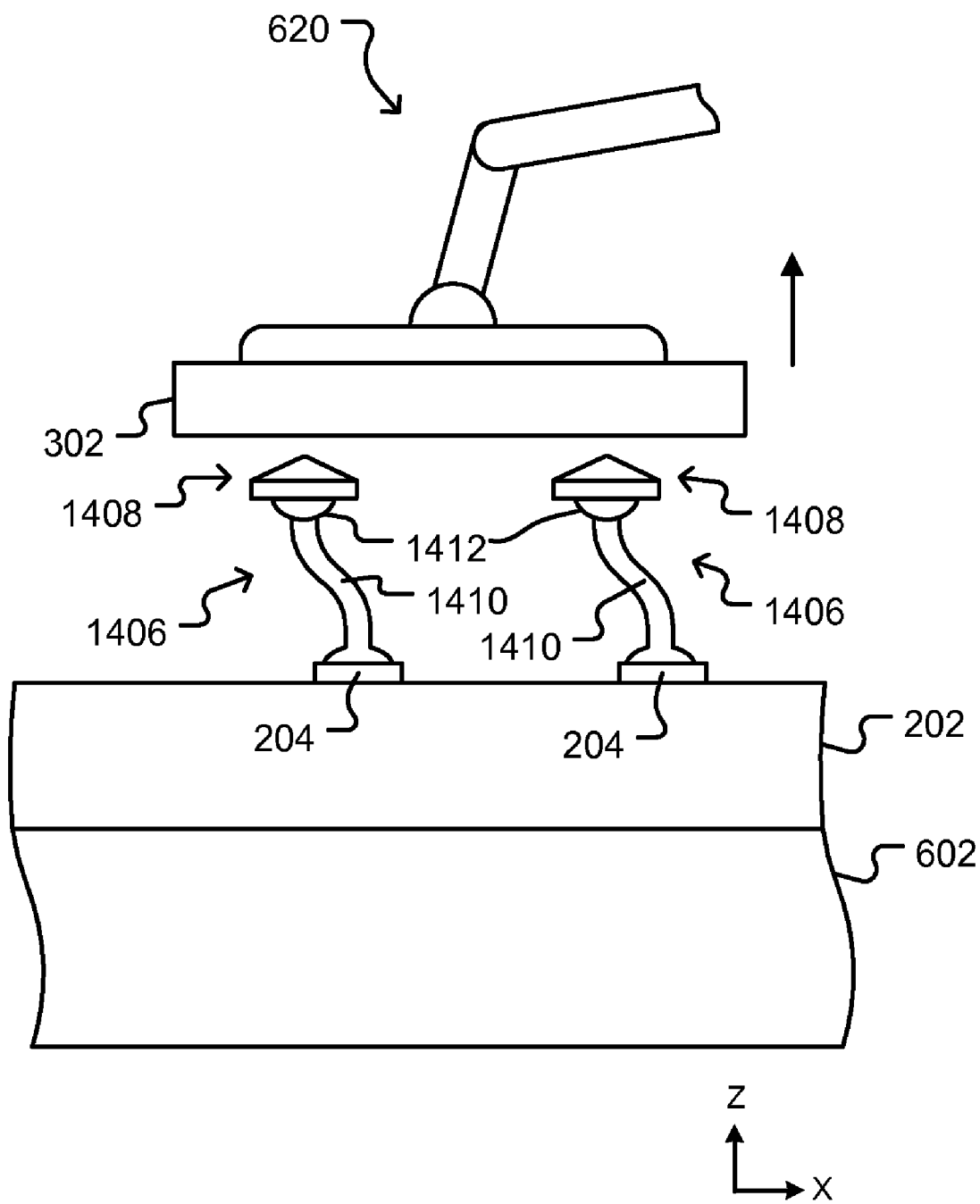
FIG. 14 shows attachment of contacts to wire stems to form contacts on the first substrate of FIG. 2 according to some embodiments of the invention.

The contact structures 306 comprising posts 308, beams 310, and contact tip structures 312 are exemplary only, and many other types of contact structures can be used. FIG. 14 illustrates another type of contact structure 1406 that can be used in place of any of the contact structures 306. The contact structures 1406 can comprise wire segments 1410 that are bonded (e.g., using standard wire bonding techniques such as those known in the semiconductor industry) to terminals 204. Contact tips 1408 can be formed on second substrates 302 (one is shown in FIG. 14 but many can be used) and attached to the wire segments 1410 by a flowable joining material 1412, which can be the same as or similar to the flowable joining material 640.

Indeed, in accordance with some embodiments of the invention, contact structures 1406 shown in FIG. 14 can be made in accordance with a modified version of the process 100 of FIG. 1 as follows. Device 200 can be provided at 102 as shown in FIG. 2 except wire segments 1410 can be attached to the terminals 204 of the first substrate 202. (The lengths of the wire segments 1410 can be made generally uniform by, for example, casting a material (not shown) around the wire segments 1410, lapping a surface of the material and thereby planarizing the material and the wire segments 1410, and removing the material.) At 104, contact tips 1408 (which can be non-limiting examples of contact elements) can be made on a plurality of second substrates 302, for example, in general accordance with the process illustrated in FIGS. 4A and 4B. For example, just contact tip structures 312 can be formed in the process illustrated in FIGS. 4A and 4B, and contact tip structures 312 so formed can be the contact tips 1408 of FIG. 14. Contact tips 1408, formed on a plurality of second substrates 302, can then be positioned and attached to ends of the wire segments 1410 generally in accordance with 106, 108 of the process 100 of FIG. 1. The contact tips 1408 can then be released from the second substrates 302 generally in accordance with 110 of FIG. 1. The result can be a group of contact structures like the group of contact structures shown in FIGS. 12A, 12B, and 12C except each contact structure 306 shown in FIGS. 12A, 12B, and 12C is replaced with a contact structure 1406 comprising a wire segment 1410 and a contact 1408 as shown in FIG. 14. In the foregoing example, the wire segments 1410 and the terminals 204 to which the wire segments 1410 are attached can be non-limiting examples of electrically conductive contact structures or contact bodies, and the contact tips 1408 can be non-limiting examples of contact elements.

Many other types of contact structures can be used in place of contact structures 306 of FIGS. 2-12C and contact structures 1406 of FIG. 14. For example wire segments 1410 in FIG. 14 can be replaced with other structures such as pogo pins, bumps, studs, stamped springs, needles, buckling beams, etc. As another example, although the contact structures 306 are shown in FIGS. 3-4B as comprising distinct posts 308, beams 310, and contact tip structures 312, contact structures 306 can alternatively be formed as monolithic structures such as the contact structures disclosed in U.S. Pat. No. 6,482,013; U.S. patent application Ser. No. 09/539,287; or U.S. Pat. No. 7,189,077. As still other examples, contact structures 306 can be formed without the posts 308 shown in FIGS. 3-4B, and the ends of the beams 310 can be attached to posts formed on terminals 204. Such posts can be like posts 308 and can be formed like posts 308 except on terminals 204. Alternatively, such posts can be single or multiple wire columns attached to the terminals 204. For example, the posts can be like the wire columns in U.S. Pat. No. 7,063,541. In any of the foregoing examples, the structures or elements attached to or formed on the terminals 204 can be non-limiting examples of electrically conductive contact structures or contact bodies, and the structures or elements formed on the second substrates 302 can be non-limiting examples of contact elements.

Figure 15:
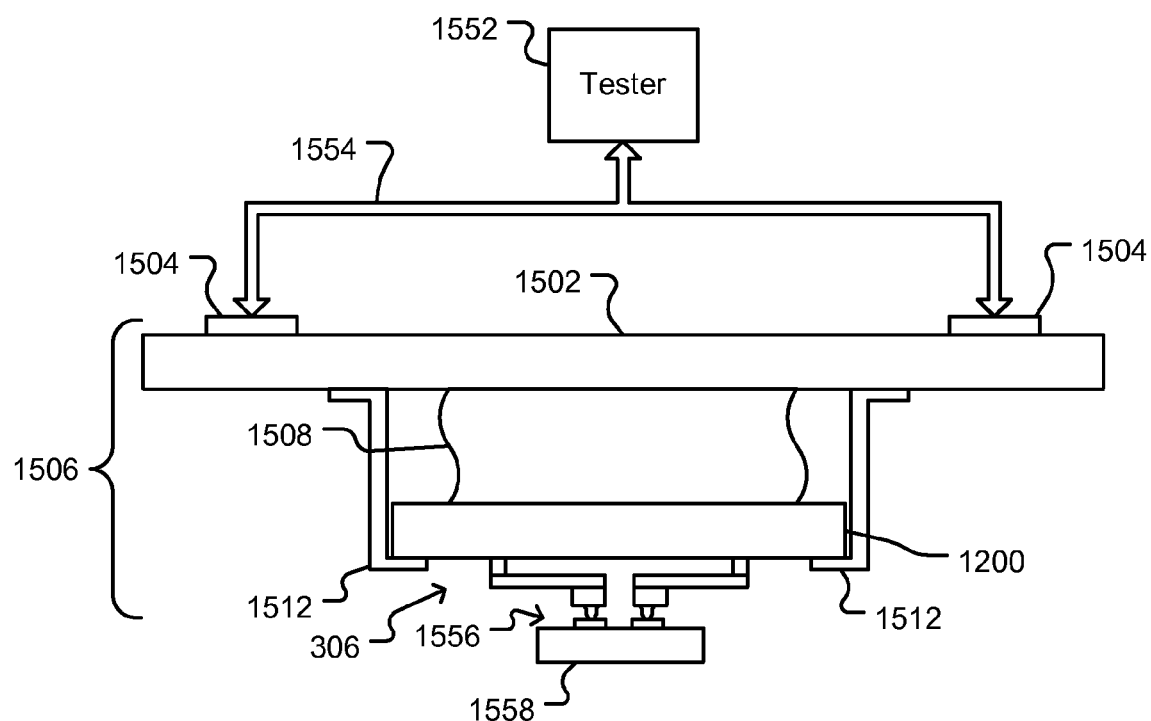
FIG. 15 illustrates an exemplary test system in which the first substrate with a group of positioned contact structures attached thereto can be used to test electronic devices.

There are many possible applications for a device like device 1200 of FIGS. 12A, 12B, and 12C with a positioned group of contact structures like contact structures 306, 1406 or any of the other possible contact structures. One such application can be in a probe card assembly, which can be used in a system for testing electronic devices, such as semiconductor dies. The positioned contact structures (e.g., 306, 1406) can be used as contacts for contacting input and/or output terminals of the electronic devices to be tested. FIG. 15 illustrates an exemplary test system 1500 that includes an exemplary probe card assembly 1506 in which the device 1200 is utilized as a probe head (1200) and its contact structures 306 are disposed to contact input and/or output terminals of the electronic devices to be tested according to some embodiments of the invention.

As shown in FIG. 15, the probe card assembly 1506 can comprise a wiring substrate 1502 and flexible electrical connections 1508, and the device 1200 of FIGS. 12A, 12B, and 12C can be a probe head 1200 in the probe card assembly 1506 of FIG. 15. The wiring substrate 1502, flexible electrical connections 1508, and probe head 1200 can be held together by brackets 1512 and/or other suitable means. The wiring substrate 1502 can include electrical connectors 1504 (which can be non-limiting examples of an electrical interface to a test controller) configured to make electrical connections with a plurality of communications channels 1554 to and from a tester 1552 (which can be a non-limiting example of a test controller). Connectors 1504 can be pads for receiving pogo pins, zero-insertion-force connectors, or any other electrical connection device suitable for making electrical connections with communications channels 1552. Electrically conductive paths (not shown) can be provided through the probe card assembly 1506 to provide electrical connections from individual electrical connections in connectors 1504 (each such individual electrical connection can correspond to one of the communications channels 1554) to contact structures 306 on probe head 1200. The contact structures 306 can be disposed to contact input and/or output terminals 1556 of an electronic device under test ("DUT") 1558. Those conductive paths (not shown) through the probe card assembly 1506 can comprise electrically conductive connections, such as traces and/or vias (not shown), from the connectors 1504 through the wiring substrate 1502 to flexible electrical connections 1508 to electrically conductive connections (not shown), such as traces and vias (not shown), through the probe head 1200 to the contact structures 306. In this way, a plurality of signal paths comprising the communications channels 1554, the above-described conductive paths (not shown) through the probe card assembly 1506, and the contact structures 306 can be provided between the tester 1552 and the input and/or output terminals 1556 of the DUT 1558.

The flexible electrical connections 1508 can be implemented with any apparatus that can provide flexible or compliant electrical connections between the wiring substrate 1502 and the probe head 1200. For example, the flexible electrical connections 1508 can comprise an interposer structure comprising a substrate and a first plurality of electrically conductive springs that extend from one surface of the substrate to make electrical connections with the wiring substrate 1502 and a second plurality of electrically conductive springs that extend from another surface of the substrate to make electrical connections with the contact substrate 1200. The first conductive springs and the second springs can be electrically connected through the substrate. In other examples, flexible electrical connections 1508 can be simple wires electrically connecting the wiring substrate 1502 and the probe head 1200. In still other examples, the flexible electrical connections 1508 can be replaced with rigid, inflexible electrical connections electrically connecting the wiring substrate 1502 and the probe head 1200.

DUT 1558 can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, or any other type of electronic device or devices The tester 1552 can be a computer, computer system, or other digital processing device or devices configured to control testing of the DUT 1558.

The configuration of probe card assembly 1506 shown in FIG. 15 is exemplary only and is simplified for ease of illustration and discussion. Many variations, modifications, and additions are possible. For example, in some embodiments, the flexible electrical connections 1508 need not be included, and the probe head 1200 can be attached and electrically connected directly to the wiring substrate 1502. As another exemplary possible modification of the probe card assembly 1506, the probe card assembly 1506 can have more than one probe head 1200, and each such probe head 1200 can be independently adjustable. Non-limiting examples of probe card assemblies with multiple probe heads, like probe head 1200, are disclosed in U.S. patent application Ser. No. 11/165,833, filed Jun. 24, 2005. Additional non-limiting examples of probe card assemblies are illustrated in U.S. Pat. No. 5,974,662 and U.S. Pat. No. 6,509,751 and the aforementioned U.S. patent application Ser. No. 11/165,833, filed Jun. 24, 2005, and various features of the probe card assemblies described in those patents and application can be implemented in the probe card assembly 1506 show in FIG. 15.

DUT 1558 can be tested as follows. The tester 1552 can generate test signals, which can be provided through the communications channels 1554 and probe card assembly 1506 and contact structures 306 to input terminals 1556 of the DUT 1558. Response signals generated by the DUT 1558 can be sensed by contact structures 306 in contact with output terminals 1556 of the DUT 1558 and provided through the probe card assembly 1506 and communications channels 1554 to the tester 1552. The tester 1552 can analyze the response signals to determine whether the DUT 1558 responded properly to the test signals and, consequently, whether the DUT 1558 passes or fails the testing. The tester 1552 can alternatively or in addition rate the performance of the DUT 1558.

Although not shown in FIGS. 12A, 12B, and 12C, the device (probe head) 1200 can include terminals (not shown) disposed on an opposite surface of the first substrate 202 from the contact structures 306, and those terminals can be electrically connected through the first substrate 202 to the contact structures 306. Utilized as probe head 1200 in FIG. 15, the terminals (not shown) disposed on the opposite surface of the first substrate 202 can be electrically connected to the electrical connections 1508, which can thus connect the connectors 1504 to the contact structures 306.

Although thirty-six contact structures 306 are shown attached to the probe head 1200 in FIGS. 12A, 12B, and 12C, more or fewer contact structures 306 can be used. In some embodiments, hundreds or even thousands of contact structures 306 can be attached to the probe head 1200, which can facilitate contacting and testing many DUTs (DUT 1558 in FIG. 15 can represent multiple such DUTs) at once.

Although specific embodiments and applications of the invention have been described in this specification, there is no intention that the invention be limited these exemplary embodiments and applications or to the manner in which the exemplary embodiments and applications operate or are described herein.

We claim:

1. A contact apparatus comprising:
   a substrate comprising terminals disposed on a surface of the substrate; and
   a plurality of contact structures attached to ones of the terminals, each contact structure comprising an attachment portion attached to one of the terminals and a tip disposed away from the surface of the substrate, wherein the tips of the plurality of contact structures are aligned in a plane such that each tip is within one micron of the plane; and
   joining material that attaches the attachment portions of the contact structures to the ones of the terminals,
   wherein:
      gaps between the attachment portions of a set of the contact structures and the terminals to which the joining material attaches the set of the contact structures are sized so that the tips of the plurality of the contact structures are aligned within the one micron of the plane, and
      there are at least two of the contact structures in the set.

2. The contact apparatus of claim 1, wherein the plurality of contact structures comprises at least fifty of the contact structures.

3. The contact apparatus of claim 1, wherein the plurality of contact structures comprises at least one hundred of the contact structures.

4. The contact apparatus of claim 1, wherein:
   the tips of the contact structures are configured to contact terminals of semiconductor dies, and
   the substrate and the contacts compose a probe card assembly comprising an electrical interface to a test controller configured to control testing of semiconductor dies and electrical connections between the interface and the contact structures.

5. A contact apparatus comprising:
   a first substrate comprising first terminals;
   a plurality of second substrates each comprising a plurality of second terminals on a first surface of the second substrate and a plurality of third terminals disposed on a second surface of the second substrate opposite the first surface, ones of the third terminals electrically connected to ones of the second terminals, the third terminals being attached to ones of the first terminals;
   a plurality of contact structures attached to the second terminals of the second substrates, each contact structure comprising an attachment portion attached to one of the second terminals and a tip disposed away from the attachment portion,
   wherein the tips of the plurality of contact structures are aligned in a plane such that each tip is within one micron of the plane; and
   a joining material that attaches the attachment portions of the contact structures to the second terminals, wherein there is a gap between the attachment portion of one of the contact structures and the second terminal to which the joining material attaches the one of the contact structures.

6. The contact apparatus of claim 5, wherein the third terminals are attached to the first terminals by solder or a conductive adhesive.

7. The contact apparatus of claim 6, wherein the joining material comprises solder or a conductive adhesive.

8. The contact apparatus of claim 5, wherein:

the tips of the contact structures are configured to contact terminals of semiconductor dies, and the substrate and the contacts compose a probe card assembly comprising an electrical interface to a test controller configured to control testing of semiconductor dies and electrical connections between the interface and the contact structures.

9. A contact apparatus comprising:

a first substrate comprising first terminals;

a plurality of second substrates each comprising a plurality of second terminals on a first surface of the second substrate and a plurality of third terminals disposed on a second surface of the second substrate opposite the first surface, ones of the third terminals electrically connected to ones of the second terminals, the third terminals being attached to ones of the first terminals;

a plurality of contact structures attached to the second terminals of the second substrates, each contact structure comprising an attachment portion attached to one of the second terminals and a tip disposed away from the attachment portion, wherein the tips of the plurality of contact structures are aligned in a plane such that each tip is within one micron of the plane; and joining material that attaches the attachment portions of the contact structures to the second terminals, wherein:

gaps between the attachment portions of a set of the contact structures and the second terminals to which the joining material attaches the set of the contact structures are sized so that the tips of the plurality of the contact structures are aligned within the one micron of the plane, and there are at least two of the contact structures in the set.

10. The contact apparatus of claim 1, wherein the gaps between at least two of the attachment portions of at least two of the contact structures and the terminals to which the at least two of the attachment portions are attached are different sizes.

* * * * *